US012740171B2

(12) United States Patent
Takachi

(10) Patent No.: US 12,740,171 B2
(45) Date of Patent: Sep. 15, 2026

(54) IMAGING ELEMENT WITH TRANSMISSIVE COVER BODY AND DIFFRACTIVE LENS, IMAGING DEVICE WITH TRANSMISSIVE COVER BODY AND DIFFRACTIVE LENS, AND METHOD FOR MANUFACTURING IMAGING ELEMENT WITH TRANSMISSIVE COVER BODY AND DIFFRACTIVE LENS

(71) Applicant: SONY SEMICONDUCTOR SOLUTIONS CORPORATION, Kanagawa (JP)

(72) Inventor: Taizo Takachi, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 444 days.

(21) Appl. No.: 18/548,647

(22) PCT Filed: Jan. 19, 2022

(86) PCT No.: PCT/JP2022/001700
§ 371 (c)(1),
(2) Date: Sep. 1, 2023

(87) PCT Pub. No.: WO2022/190653
PCT Pub. Date: Sep. 15, 2022

(65) Prior Publication Data
US 2024/0145510 A1 May 2, 2024

(30) Foreign Application Priority Data
Mar. 9, 2021 (JP) ................................ 2021-037662

(51) Int. Cl.
*H10F 39/00* (2025.01)

(52) U.S. Cl.
CPC ....... *H10F 39/8063* (2025.01); *H10F 39/024* (2025.01); *H10F 39/805* (2025.01)

(58) Field of Classification Search
CPC .... H10F 39/024; H10F 39/804; H10F 39/805; H10F 39/806; H10F 39/8063;
(Continued)

(56) References Cited

U.S. PATENT DOCUMENTS

2009/0035887 A1* 2/2009 Suzuki .................. H10F 39/805 438/57
2010/0091168 A1 4/2010 Igarashi et al.
2013/0032914 A1* 2/2013 Iwasaki ................ H10F 39/806 257/E31.127

FOREIGN PATENT DOCUMENTS

JP 2009-145809 7/2009
JP 2010-098066 4/2010
(Continued)

OTHER PUBLICATIONS

International Search Report and Written Opinion prepared by the Japan Patent Office on Apr. 13, 2022, for International Application No. PCT/JP2022/001700, 2 pgs.

*Primary Examiner* — Nelson Garces
(74) *Attorney, Agent, or Firm* — SHERIDAN ROSS P.C.

(57) ABSTRACT

Technology advantageous for acquiring a high-quality image with a small device configuration is provided. An imaging element includes: a pixel substrate including an image sensor; a cover body facing the image sensor, the cover body being transmissive; a diffractive lens having a plurality of protruding lens portions protruding from the cover body toward the image sensor, in which a space is provided between the plurality of protruding lens portions.

20 Claims, 31 Drawing Sheets

(58) Field of Classification Search
CPC ... H10F 39/809; H10F 39/811; G02B 13/001; G02B 13/0055; G02B 27/0037; G02B 27/0056
See application file for complete search history.

(56) References Cited

FOREIGN PATENT DOCUMENTS

| | | |
|---|---|---|
| JP | 2013-038164 | 2/2013 |
| JP | 2014-078015 | 5/2014 |

* cited by examiner

Figure 30:
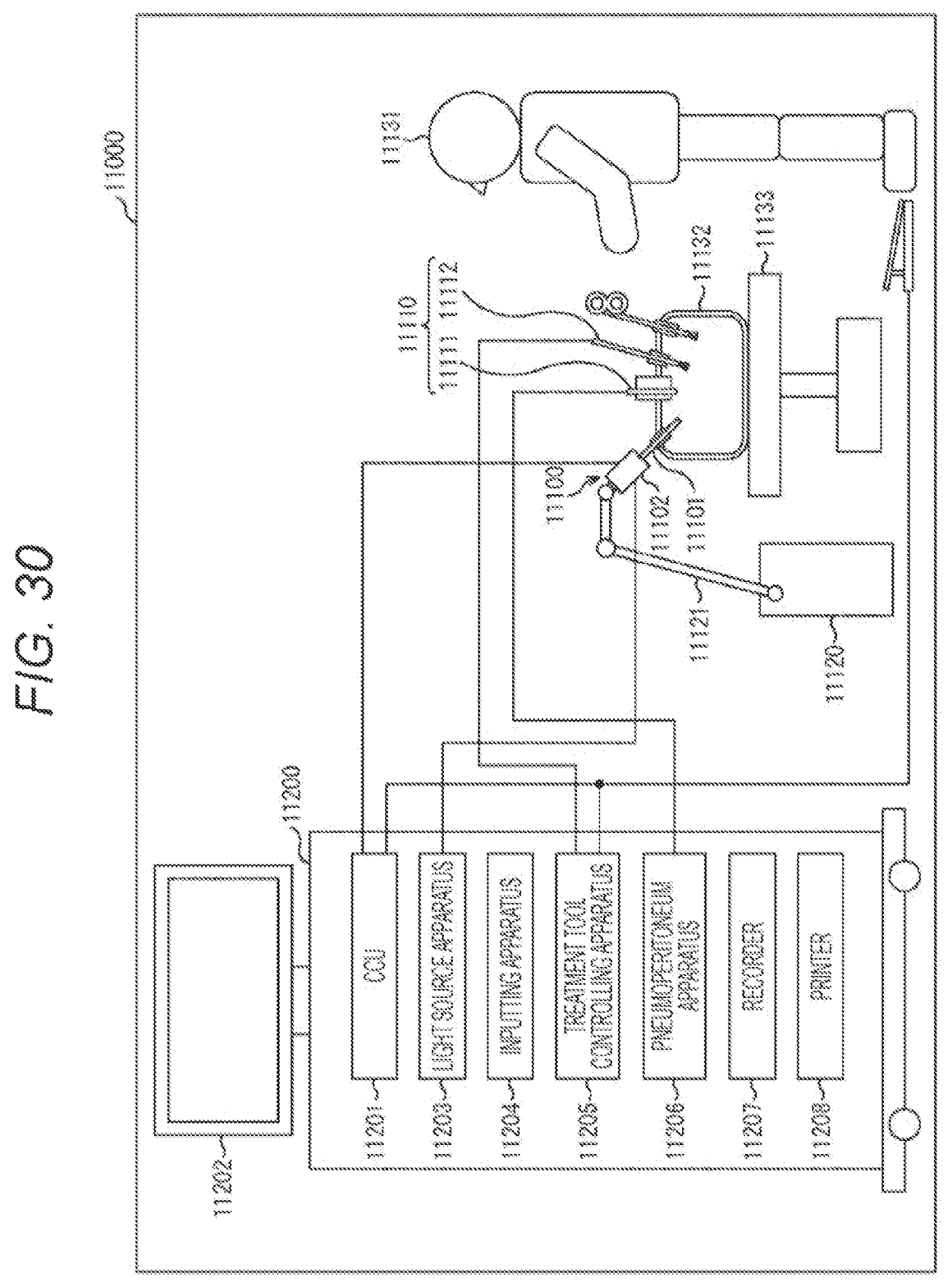

11000
11131
11110
11111
11112
11132
11133
11100
11102
11101
11121
11120
11200
CCU
LIGHT SOURCE APPARATUS
INPUTTING APPARATUS
TREATMENT TOOL CONTROLLING APPARATUS
PNEUMOPERITONEUM APPARATUS
RECORDER
PRINTER
11201
11203
11204
11205
11206
11207
11208
11202

IMAGING ELEMENT WITH TRANSMISSIVE COVER BODY AND DIFFRACTIVE LENS, IMAGING DEVICE WITH TRANSMISSIVE COVER BODY AND DIFFRACTIVE LENS, AND METHOD FOR MANUFACTURING IMAGING ELEMENT WITH TRANSMISSIVE COVER BODY AND DIFFRACTIVE LENS

CROSS REFERENCE TO RELATED APPLICATIONS

This application is a national stage application under 35 U.S.C. 371 and claims the benefit of PCT Application No. PCT/JP2022/001700, having an international filing date of 19 Jan. 2022, which designated the United States, which PCT application claimed the benefit of Japanese Patent Application No. 2021-037662 filed 9 Mar. 2021, the entire disclosures of each of which are incorporated herein by reference.

TECHNICAL FIELD

The present disclosure relates to an imaging element, an imaging device, and a method for manufacturing an imaging element.

BACKGROUND ART

In a general imaging device (camera), imaging light is condensed on an image sensor (for example, a CMOS image sensor) by using geometric optical refraction of a lens.

Meanwhile, against the background of increasing demands for high resolution and miniaturization in recent years, not only lenses using geometric optical refraction (hereinafter also referred to as "geometric optical lenses") but also lenses using other optical characteristics have been proposed.

For example, Patent Document 1 discloses an optical lens using light diffraction.

CITATION LIST

Patent Document

Patent Document 1: Japanese Patent Application Laid-Open No. 2014-78015

SUMMARY OF THE INVENTION

Problems to be Solved by the Invention

In a case where the above-described geometric optical lens and a lens using light diffraction (hereinafter also referred to as a "diffractive lens") are applied to a high-resolution and small imaging device, it is necessary to suppress a defect in optical characteristics (for example, chromatic aberration) by a small lens configuration.

The present disclosure has been made in view of the above circumstances, and provides technology advantageous for acquiring a high-quality image with a small device configuration.

Solutions to Problems

One aspect of the present disclosure relates to an imaging element including: a pixel substrate including an image sensor; a cover body facing the image sensor, the cover body being transmissive; a diffractive lens having a plurality of protruding lens portions protruding from the cover body toward the image sensor, in which a space is provided between the plurality of protruding lens portions.

The imaging element may include a photocurable resin film located between the image sensor and the diffractive lens and in contact with the plurality of protruding lens portions.

The imaging element may include an inorganic film located between the image sensor and the diffractive lens and in contact with the plurality of protruding lens portions.

The imaging element may include a plurality of lens constituent layers stacked on each other, in which each of the plurality of lens constituent layers includes the cover body and the diffractive lens.

The diffractive lens may be located 60 μm or less away from the image sensor.

Planar sizes of the plurality of protruding lens portions may periodically change with reference to a distance from an optical axis, and a cycle of change in the planar sizes of the plurality of protruding lens portions may be based on a phase difference of 360° of light diffraction of the plurality of protruding lens portions, and in each cycle, the planar sizes of the plurality of the protruding lens portions may decrease as the distance from the optical axis increases.

Planar sizes of the plurality of protruding lens portions may periodically change with reference to a distance from an optical axis, and a cycle of change in the planar sizes of the plurality of protruding lens portions may be based on a phase difference of 360° of light diffraction of the plurality of protruding lens portions, and in each cycle, the planar sizes of the plurality of the protruding lens portions may increase as the distance from the optical axis increases.

The imaging element may include a fixing portion that is located between the pixel substrate and the cover body and fixes the cover body to the pixel substrate.

A space may be provided between the image sensor and the diffractive lens.

The imaging element may include: a support body that supports the pixel substrate; and a fixing portion that is located between the support body and the cover substrate and fixes the cover body to the support body.

Another aspect of the present disclosure relates to an imaging device including: a pixel substrate including an image sensor; a cover body facing the image sensor, the cover body being transmissive; a diffractive lens having a plurality of protruding lens portions protruding from the cover body toward the image sensor; and an imaging lens located on a side opposite to the pixel substrate via the cover body, in which a space is formed between the plurality of protruding lens portions.

The diffractive lens may reduce chromatic aberration of the imaging lens.

The diffractive lens may emit light at a principal ray incident angle smaller than a principal ray incident angle of light from the imaging lens toward the diffractive lens.

Another aspect of the present disclosure relates to a method for manufacturing an imaging element, the method including: fixing a cover body that is transmissive to a pixel substrate including an image sensor in which a plurality of protruding lens portions constituting a diffractive lens and provided with a space therebetween is fixed to the cover body, and the cover body is fixed to the pixel substrate such that the plurality of protruding lens portions is located between the cover body and the pixel substrate.

The method for manufacturing the imaging element may include: applying a photocurable resin onto the pixel substrate; and curing a portion covering the image sensor in the photocurable resin on the pixel substrate by light irradiation, in which the cover body is fixed to the pixel substrate while the plurality of protruding lens portions faces a portion of the photocurable resin on the pixel substrate cured by the light irradiation.

The method for manufacturing the imaging element may include applying an inorganic film on the pixel substrate, in which the cover body is fixed to the pixel substrate while the plurality of protruding lens portions faces the inorganic film.

BRIEF DESCRIPTION OF DRAWINGS

FIG. 6 is a cross-sectional view illustrating an example of a structure of a lower substrate and an upper substrate, and illustrates a part of an imaging element in an enlarged manner.

FIG. 30 is a view illustrating an example of a schematic configuration of an endoscopic surgery system.

MODE FOR CARRYING OUT THE INVENTION

Figure 1:
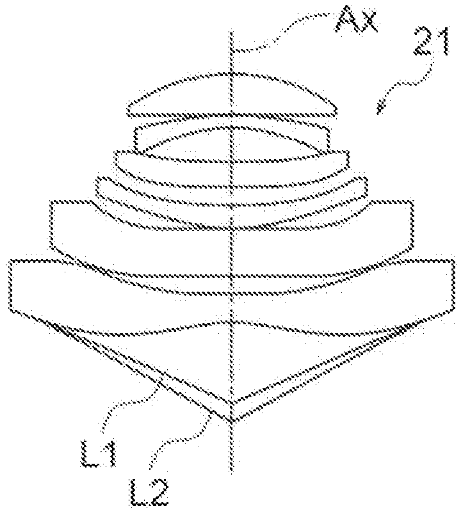
FIG. 1 is a view illustrating focal points of short-wavelength light and long-wavelength light that have passed through a unit including a plurality of geometric optical lenses.

FIG. 1 is a view illustrating focal points of short-wavelength light L1 and long-wavelength light L2 that have passed through a unit including a plurality of geometric optical lenses (hereinafter also simply referred to as "geometric optical lens 21").

In the geometric optical lens 21 using geometric optical refraction, the longer the wavelength of light, the smaller the refractive index, and the longer the focal length (see "long-wavelength light L2" illustrated in FIG. 1). That is, the geometric optical lens 21 has a larger refractive index and a shorter focal length as the wavelength of light is shorter (see "short-wavelength light L1" illustrated in FIG. 1).

In a case where the imaging light is condensed on the image sensor by the geometric optical lens 21 having the above characteristics, it is necessary to combine a plurality of lenses in order to suppress chromatic aberration.

Figure 2:
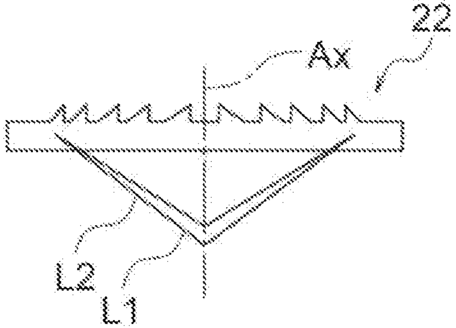
FIG. 2 is a view illustrating focal points of short-wavelength light and long-wavelength light that have passed through a diffractive lens using light diffraction.

FIG. 2 is a view illustrating focal points of short-wavelength light L1 and long-wavelength light L2 that have passed through a diffractive lens 22 using light diffraction.

The diffractive lens 22 exhibits a larger refractive index and a shorter focal length as the wavelength of light is longer (see "long-wavelength light L2" illustrated in FIG. 2). That is, the diffractive lens 22 has a smaller refractive index and a longer focal length as the wavelength of light is shorter (see "short-wavelength light L1" in FIG. 2).

As described above, the geometric optical lens 21 and the diffractive lens 22 exhibit opposite refractive characteristics with respect to the wavelength of the incident light. Therefore, by combining the geometric optical lens 21 and the diffractive lens 22, it is possible to effectively reduce the chromatic aberration while suppressing the enlargement of the size in the direction along the optical axis Ax of the optical lens system (hereinafter also referred to as "optical axis direction").

Figure 3:
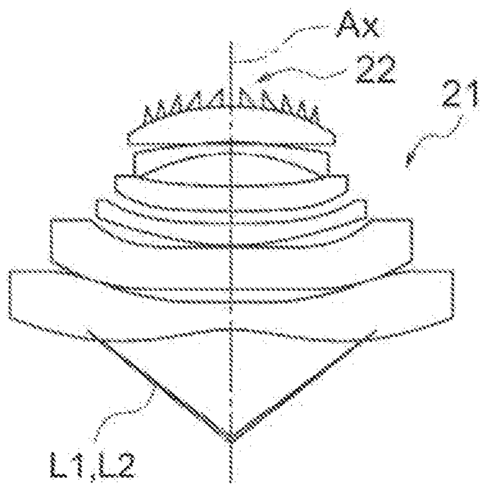
FIG. 3 is a view illustrating focal points of short-wavelength light and long-wavelength light that have passed through an optical lens system including a geometric optical lens and a diffractive lens.

FIG. 3 is a view illustrating focal points of short-wavelength light L1 and long-wavelength light L2 that have passed through an optical lens system including the geometric optical lens 21 and the diffractive lens 22. In the example illustrated in FIG. 3, the diffractive lens 22 is attached to the surface of the lens located closest to the subject side among the units of the geometric optical lens 21.

By combining the geometric optical lens 21 and the diffractive lens 22 in this manner, it is possible to cause the focal point of the short-wavelength light L1 and the focal point of the long-wavelength light L2 to coincide with or approach each other while suppressing the expansion of the optical lens system in the optical axis direction.

Although the optical characteristics of the entire optical lens system can be improved by combining the diffractive lens 22 with the geometric optical lens 21 as described above, the installation of the diffractive lens 22 is not necessarily easy.

That is, in order to realize desired optical characteristics by the diffractive lens 22, it is necessary to arrange the lens piece of the diffractive lens 22 at a desired position. However, it is not easy to accurately arrange and fix the diffractive lens 22 having a fine structure having a specific shape at a desired position on the lens curved surface. In particular, in recent years, an optical lens system having higher resolution has been required along with the advancement of higher pixel counts, and the lens piece of the diffractive lens 22 tends to have a finer and more complicated shape.

The advanced lens optical characteristics can also be realized by increasing the number of lenses included in the geometric optical lens 21 as described above. Meanwhile, in imaging devices mounted on mobile terminals such as smartphones, it is required to reduce the size, thickness, and weight of the optical lens system from the viewpoint of improving mobility. An increase in the number of lenses for improving the performance of the optical lens system and downsizing for improving the mobility or the like are mutually contradictory requirements.

In addition, in a case where the optical lens system is thinned in order to reduce the thickness of the imaging device, the incident angle of light (principal ray incident angle: CRA) on the image sensor tends to increase, but when the principal ray incident angle increases, the sensor sensitivity decreases, and the quality of the captured image deteriorates. Note that, as the principal ray incident angle approaches 0°, the traveling direction of the light toward the image sensor approaches the optical axis direction, and as the principal ray incident angle increases, the traveling direction of the light toward the image sensor approaches the direction perpendicular to the optical axis.

Hereinafter, an example of an imaging element and an imaging device advantageous for acquiring a high-quality image with a small device configuration and an example of a method for manufacturing such an imaging element and an imaging device will be described.

First Embodiment

Figure 4:
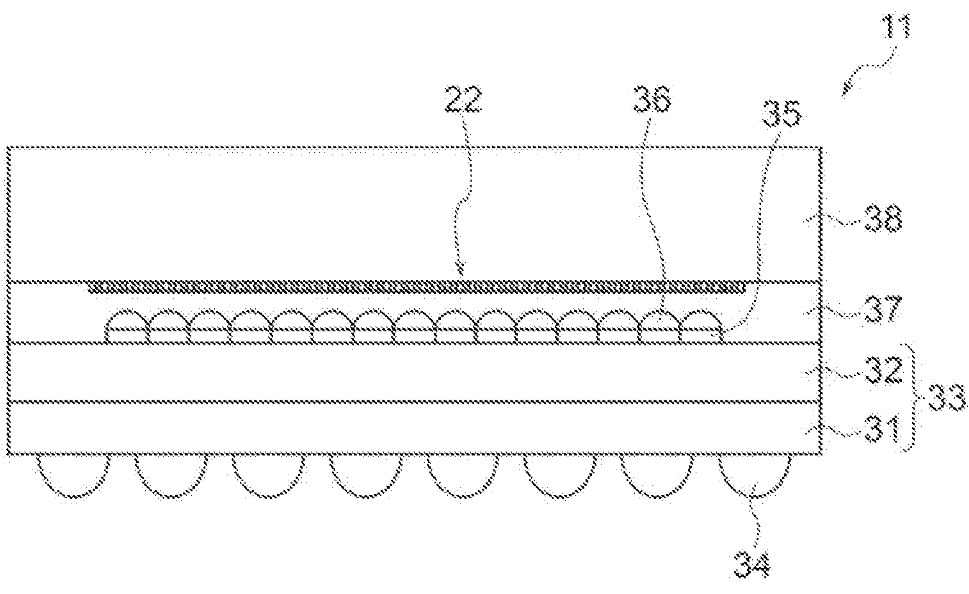
FIG. 4 is a cross-sectional view illustrating an example of an imaging element according to a first embodiment.
Figure 5:
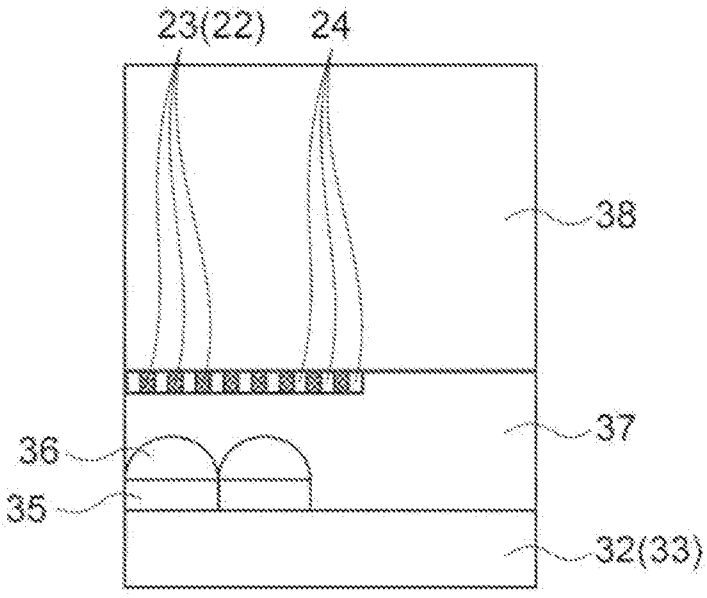
FIG. 5 is an enlarged cross-sectional view illustrating a part of the imaging element illustrated in FIG. 4.

FIG. 4 is a cross-sectional view illustrating an example of an imaging element 11 according to a first embodiment. FIG. 5 is an enlarged cross-sectional view illustrating a part of the imaging element 11 illustrated in FIG. 4.

The imaging element 11 illustrated in FIGS. 4 and 5 is a semiconductor package in which a pixel substrate 33 including a lower substrate 31 and an upper substrate 32 stacked is packaged.

The imaging element 11 receives imaging light traveling from the top to the bottom in FIG. 4, converts the imaging light into an electric signal, and outputs the electric signal (that is, image data).

On the lower substrate 31, a plurality of solder balls 34 which is back electrodes for electrically connecting with an external substrate (not illustrated) is formed.

On the upper surface of the upper substrate 32, color filters 35 of red (R), green (G), and blue (B), and on-chip lenses 36 that cover the color filters 35 are provided.

A cover body 38 is fixed to the upper substrate 32 via a sealing resin 37. The sealing resin 37 functions as an adhesive layer that adheres the cover body 38 to the upper substrate 32, and also functions as a sealing layer that blocks the color filters 35 and the on-chip lenses 36 from the outside.

As an example, a pixel region including a plurality of two-dimensionally arranged image sensors (photoelectric conversion elements) and a control circuit that controls the plurality of image sensors are formed on the upper substrate 32. Meanwhile, a logic circuit such as a circuit that processes pixel signals from a plurality of image sensors is formed on the lower substrate 31.

As another example, only the pixel region may be formed on the upper substrate 32, and the control circuit and the logic circuit may be formed on the lower substrate 31.

By forming the pixel region, the control circuit, and the logic circuit on the lower substrate 31 and the upper substrate 32 having the stacked structure in this manner, it is possible to suppress expansion of the imaging element 11 in the planar direction and to promote downsizing of the planar size of the imaging element 11.

Figure 6:
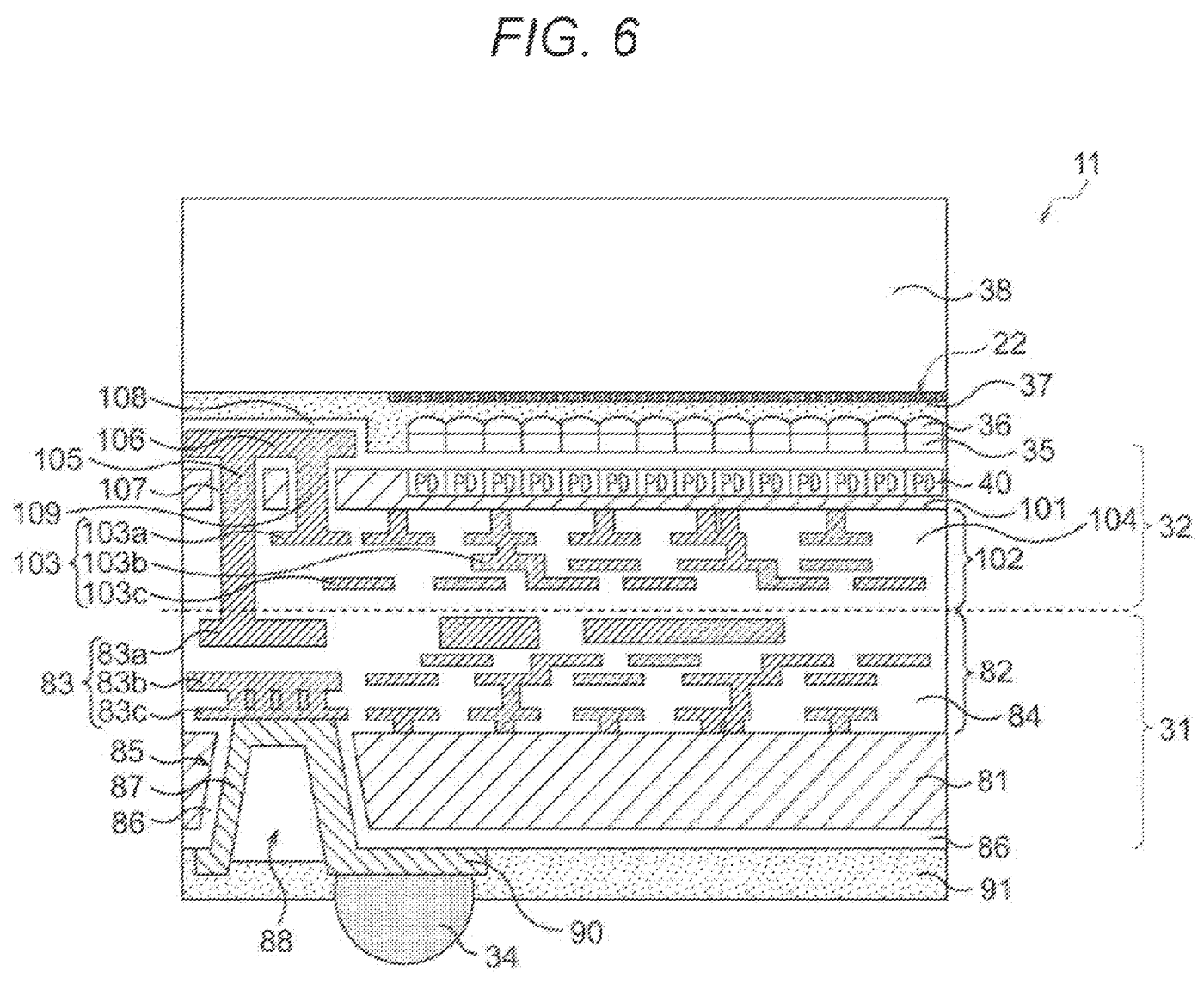

FIG. 6 is a cross-sectional view illustrating an example of a structure of the lower substrate 31 and the upper substrate 32, and a part of the imaging element 11 is illustrated in an enlarged manner.

In the lower substrate 31, a multilayer wiring layer 82 is formed on the upper side (upper substrate 32 side) of a semiconductor substrate 81 (hereinafter also referred to as a "silicon substrate 81") constituted by, for example, silicon (Si). The multilayer wiring layer 82 constitutes, for example, the control circuit and the logic circuit described above.

The multilayer wiring layer 82 includes a plurality of wiring layers 83 including an uppermost wiring layer 83*a* closest to the upper substrate 32, an intermediate wiring layer 83*b*, a lowermost wiring layer 83*c* closest to the silicon substrate 81, and the like, and an inter-layer insulating film 84 formed between the wiring layers 83.

The plurality of wiring layers 83 is formed using, for example, copper (Cu), aluminum (Al), tungsten (W), or the like, and the inter-layer insulating film 84 is formed using, for example, a silicon oxide film, a silicon nitride film, or the like. In each of the plurality of wiring layers 83 and the inter-layer insulating film 84, all the layers may include the same material, or two or more materials may be used depending on the layer.

A silicon through hole 85 penetrating the silicon substrate 81 is formed at a predetermined position of the silicon substrate 81. A connection conductor 87 is embedded in the inner wall of the silicon through hole 85 via an insulating film 86 to form a through silicon via (TSV) 88. The insulating film 86 can be constituted by, for example, a $SiO_2$ film, a SiN film, or the like.

Note that, in the through silicon via 88 illustrated in FIG. 6, the insulating film 86 and the connection conductor 87 are formed along the inner wall surface, and the inside of the silicon through hole 85 is hollow. However, depending on the inner diameter, the entire inside of the silicon through hole 85 may be filled with the connection conductor 87. In other words, the inside of the through hole may be filled with a conductor, or a part of the through hole may be a hollow. It similarly applies to a through chip via (TCV) 105 and the like as described later.

The connection conductor 87 of the through silicon via 88 is connected to a redistribution layer 90 formed on the lower surface side of the silicon substrate 81, and the redistribution layer 90 is connected to the solder ball 34. The connection conductor 87 and the redistribution layer 90 can be formed using, for example, copper (Cu), tungsten (W), titanium (Ti), tantalum (Ta), titanium tungsten alloy (TiW), polysilicon, or the like.

Furthermore, on the lower surface side of the silicon substrate 81, a solder mask (solder resist) 91 is formed so as to cover the redistribution layer 90 and the insulating film 86 except for the region where the solder balls 34 are formed.

Meanwhile, in the upper substrate 32, a multilayer wiring layer 102 is formed on the lower side (lower substrate 31 side) of a semiconductor substrate 101 (hereinafter also referred to as "silicon substrate 101") constituted by silicon (Si). The multilayer wiring layer 102 constitutes, for example, a pixel circuit in a pixel region.

The multilayer wiring layer 102 includes a plurality of wiring layers 103 including an uppermost wiring layer 103*a* closest to the silicon substrate 101, an intermediate wiring layer 103*b*, a lowermost wiring layer 103*c* closest to the lower substrate 31, and the like, and an inter-layer insulating film 104 formed between the wiring layers 103.

As the material used as the plurality of wiring layers 103 and the inter-layer insulating film 104, the same type of material as the material of the wiring layer 83 and the inter-layer insulating film 84 described above can be adopted. Furthermore, the plurality of wiring layers 103 and the inter-layer insulating film 104 may be formed by using one or two or more materials, which is similar to the wiring layer 83 and the inter-layer insulating film 84 described above.

Note that, in the example of FIG. 6, the multilayer wiring layer 102 of the upper substrate 32 includes the three wiring layers 103, and the multilayer wiring layer 82 of the lower substrate 31 includes the four wiring layers 83. However, the total number of wiring layers is not limited thereto, and any number of wiring layers can be formed.

In the silicon substrate 101, an image sensor 40 including a photodiode formed by a PN junction is formed for each pixel.

Furthermore, although not illustrated, a plurality of pixel transistors such as a first transfer transistor 52 and a second transfer transistor 54, a memory unit (MEM) 53, and the like is also formed in the multilayer wiring layer 102 and the silicon substrate 101.

At a predetermined position of the silicon substrate 101 where the color filter 35 and the on-chip lens 36 are not formed, a through silicon via 109 connected to the wiring layer 103*a* of the upper substrate 32 and a through chip via 105 connected to the wiring layer 83*a* of the lower substrate 31 are formed.

The through chip via 105 and the through silicon via 109 are connected by a connection wiring 106 formed on the upper surface of the silicon substrate 101. Furthermore, an insulating film 107 is formed between each of the through silicon via 109 and the through chip via 105 and the silicon substrate 101. Moreover, on the upper surface of the silicon substrate 101, a color filter 35 and an on-chip lens 36 are formed via an insulating film (planarization film) 108.

As described above, the pixel substrate 33 of the solid-state imaging device 1 illustrated in FIG. 1 has a stacked structure in which the multilayer wiring layer 82 side of the lower substrate 31 and the multilayer wiring layer 102 side of the upper substrate 32 are bonded together. In FIG. 6, a bonding surface between the multilayer wiring layer 82 of the lower substrate 31 and the multilayer wiring layer 102 of the upper substrate 32 is indicated by a broken line.

Furthermore, in the pixel substrate 33 of the solid-state imaging device 1, the wiring layer 103 of the upper substrate 32 and the wiring layer 83 of the lower substrate 31 are connected by two through electrodes of the through silicon via 109 and the through chip via 105. The wiring layer 83 of the lower substrate 31 and the solder ball (back electrode) 14 are connected to the through silicon via 88 and the redistribution layer 90. As a result, the plane area of the solid-state imaging device 1 can be minimized.

As described above, according to the imaging element 11 illustrated in FIG. 6, a small semiconductor device (semiconductor package) can be realized.

As described above, the imaging element 11 includes the pixel substrate 33 including the image sensor 40 on which the imaging light is incident, and the transmissive cover body 38 facing the image sensor 40. Then, the sealing resin 37 located between the pixel substrate 33 and the cover body 38 serves as a fixing portion, and fixes the cover body 38 to the pixel substrate 33. As a result, the pixel substrate 33 and the cover body 38 are integrated.

Furthermore, the imaging element 11 of the present embodiment includes the diffractive lens 22 attached to the cover body 38.

The cover body 38 illustrated in FIGS. 4 to 6 has two flat surfaces (that is, a front surface and a back surface) located apart from each other in the optical axis direction and extending in a direction perpendicular to the optical axis Ax. The diffractive lens 22 is attached to one of these flat surfaces of the cover body 38 (that is, the back surface facing the pixel substrate 33).

The diffractive lens 22 includes a plurality of protruding lens portions 23 protruding from the cover body 38 toward the pixel substrate 33 (particularly, the image sensor 40), and a space (that is, an air gap 24) is provided between the protruding lens portions 23.

In the present embodiment, the air gap 24 formed between the adjacent protruding lens portions 23 maintains the state of the space without being filled with a member such as the sealing resin 37. As a result, the diffractive lens 22 can maintain the original fine uneven shape and exhibit and maintain excellent optical characteristics.

That is, by appropriately securing the air gap 24 between the protruding lens portions 23, a large refractive index difference can be created at the boundary between the protruding lens portions 23. Therefore, the diffractive lens 22 of the present embodiment can inherently have high lens performance with respect to refraction, and can be configured as a lens exhibiting a high refractive index.

The actual refractive index of the diffractive lens 22 can be changed by appropriately adjusting the shape, size, and the like of each protruding lens portion 23. Therefore, the diffractive lens 22 of the present embodiment can support a wide refractive index range, and is provided so as to selectively indicate a desired refractive index within the refractive index range.

As described above, according to the present embodiment, the diffractive lens 22 exhibiting a desired light refractive characteristic can be designed with a high degree of freedom.

In addition, the diffractive lens 22 of the present embodiment (particularly, the distal end portions of the plurality of protruding lens portions 23) is in contact with the sealing resin 37 and supports the pixel substrate 33 (that is, the lower substrate 31 and the upper substrate 32) via the sealing resin 37.

As a result, deformation of the pixel substrate 33 (for example, the upper substrate 32 including the image sensor 40) is suppressed, and the distance between the diffractive lens 22 and the image sensor 40 can be stably and uniformly maintained at a desired distance.

For example, in a case where the imaging element 11 has a cavity structure in which a space is provided between the protruding lens portion 23 and the image sensor 40 (see FIG. 22 to be described later), a large refractive index difference exists at a boundary between the protruding lens portions 23, and thus the diffractive lens 22 has high refraction performance.

Meanwhile, if a space exists between the protruding lens portion 23 and the image sensor 40, the pixel substrate 33 is easily bent, and for example, the pixel substrate 33 may be unintentionally warped toward the diffractive lens 22. When the pixel substrate 33 (particularly, the image sensor 40) bends, the condensing position of the imaging light by the diffractive lens 22 and the light incident surface (that is, the imaging surface) of the image sensor 40 deviate from each other, imaging is performed in a defocus state, and quality of the captured image is deteriorated.

On the other hand, according to the imaging element 11 of the present embodiment illustrated in FIGS. 4 to 6, since the pixel substrate 33 is supported by the diffractive lens 22, it is possible to suppress the occurrence of deflection of the pixel substrate 33 (particularly, warpage toward the diffractive lens 22). As a result, the distance between the diffractive lens 22 and the pixel substrate 33 (in particular, the image sensor 40) can be kept constant over the entire imaging surface, and the light condensing performance of the imaging element 11 can be improved.

Furthermore, since the pixel substrate 33 is supported by the diffractive lens 22 via the sealing resin 37, it is possible to suppress unintended bending of the pixel substrate 33 while suppressing an increase in the distance (that is, the optical path length) between the diffractive lens 22 and the pixel substrate 33.

For example, in a case where the pixel substrate 33 is supported by a support body provided on the side opposite to the cover body 38 via the pixel substrate 33 (see FIG. 23 to be described later), the deflection of the pixel substrate 33 can be prevented, but the optical path length tends to be long.

That is, in a case where a support body that supports the pixel substrate 33 from the outside is provided, the pixel substrate 33 and an external substrate (not illustrated) are connected to each other via wiring such as wire bond (WB). For such wiring installation, it is necessary to secure a space in the optical axis direction, and the distance between the diffractive lens 22 attached to the back surface of the cover body 38 and the pixel substrate 33 (in particular, the image sensor 40) increases, and the optical path length increases. As a result, the chromatic aberration of the imaging light condensed on the image sensor 40 via the diffractive lens 22 increases, and the size (thickness) in the optical axis direction of the entire imaging element 11 increases.

On the other hand, according to the imaging element 11 of the present embodiment illustrated in FIGS. 4 to 6, a support body that supports the pixel substrate 33 from the outside is unnecessary. Therefore, the solder ball 34 can be provided as a wiring connecting the imaging element 11 and the external substrate, and wire bond wiring for connecting the pixel substrate 33 and the external substrate (not illustrated) is unnecessary. Therefore, the diffractive lens 22 can be installed close to the pixel substrate 33 (in particular, the image sensor 40), and the optical path length can be shortened.

As a result, the imaging element 11 of the present embodiment can acquire a high-quality captured image in which chromatic aberration is suppressed, and it is also possible to reduce the size of the imaging element 11 in the optical axis direction.

Figure 7:
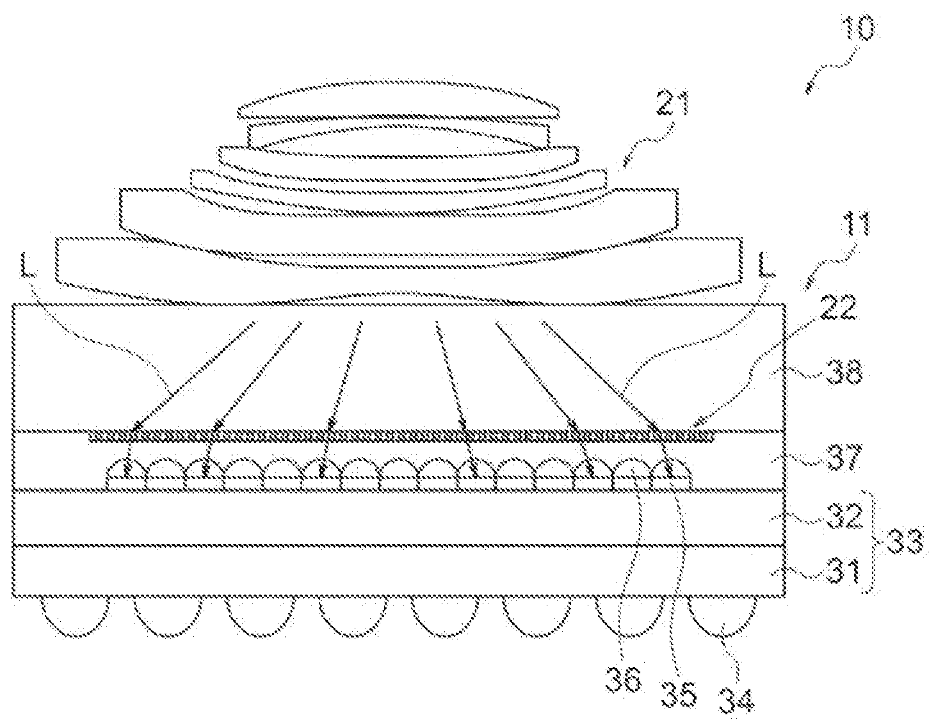
FIG. 7 is a cross-sectional view illustrating an example of an imaging device including a geometric optical lens and an imaging element.
Figure 8:
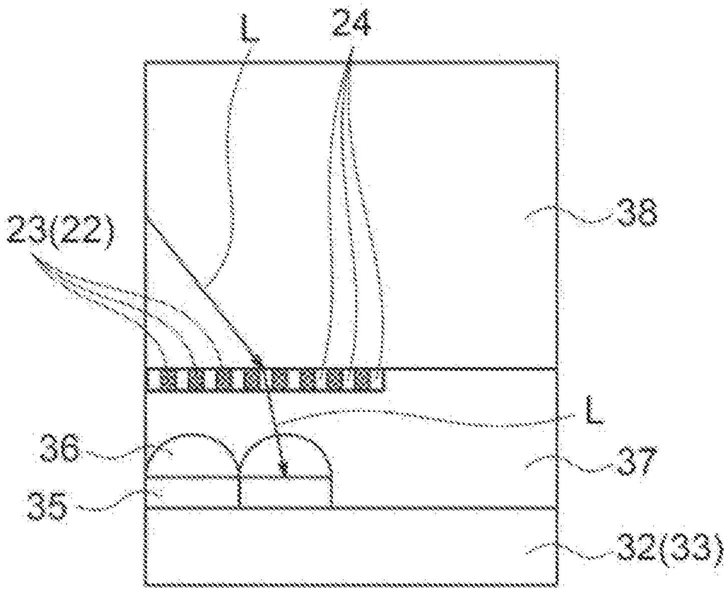
FIG. 8 is an enlarged cross-sectional view illustrating a part of the imaging element illustrated in FIG. 7.

FIG. 7 is a cross-sectional view illustrating an example of an imaging device 10 including the geometric optical lens 21 and the imaging element 11. FIG. 8 is an enlarged cross-sectional view illustrating a part of the imaging element 11 illustrated in FIG. 7.

The imaging device 10 illustrated in FIG. 7 includes the imaging element 11 illustrated in FIG. 4 described above, and the geometric optical lens 21 (imaging lens) located on the side opposite to the pixel substrate 33 via the cover body 38. As described above, the imaging element 11 includes the diffractive lens 22, the diffractive lens 22 includes the plurality of protruding lens portions 23 protruding from the cover body 38 toward the image sensor 40, and the air gap 24 is formed between the plurality of protruding lens portions 23.

The imaging light L of the subject image is incident on the image sensor 40 (see FIG. 6) of the pixel substrate 33 through the geometric optical lens 21, the cover body 38, the diffractive lens 22, the on-chip lens 36, and the color filter 35.

At this time, the imaging light L is mainly refracted by the geometric optical lens 21, the diffractive lens 22, and the on-chip lens 36, the traveling direction of the imaging light L is adjusted, and the imaging light L is guided toward the image sensor 40. Therefore, the optical characteristics and configuration of the diffractive lens 22 can be determined according to the optical characteristics (for example, refractive characteristics) of the geometric optical lens 21 to be actually used. Alternatively, the optical characteristics and the configuration of the geometric optical lens 21 can be determined according to the optical characteristics (for example, refractive characteristics) of the diffractive lens 22 that is actually used.

Typically, the optical characteristics (in particular, the refractive characteristics) and the configuration of the diffractive lens 22 are determined such that the chromatic aberration of the geometric optical lens 21 is reduced by the diffractive lens 22.

In addition, the optical characteristics (particularly, the refractive characteristics) and the configuration of the diffractive lens 22 are determined such that the diffractive lens 22 emits the imaging light L at a principal ray incident angle smaller than a principal ray incident angle (CRA) of the imaging light L from the geometric optical lens 21 toward the diffractive lens 22.

As described above, the diffractive lens 22 can function not only as a lens for correcting the chromatic aberration of the geometric optical lens 21 but also as a lens for improving the principal ray incident angle, and the shading characteristics of the entire optical lens system can be improved.

Figure 9:
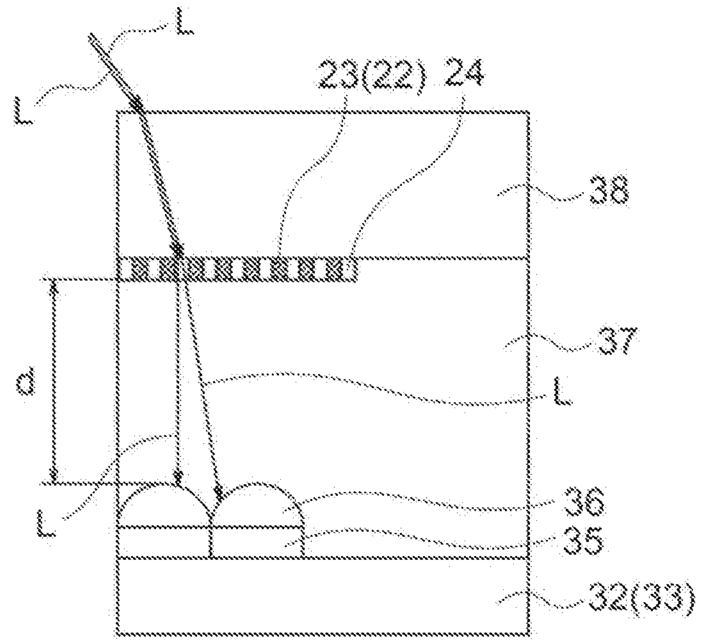
FIG. 9 is an enlarged cross-sectional view illustrating a part of the imaging element, and is a view for illustratively explaining a case where color mixing occurs between adjacent image sensors.
Figure 10:
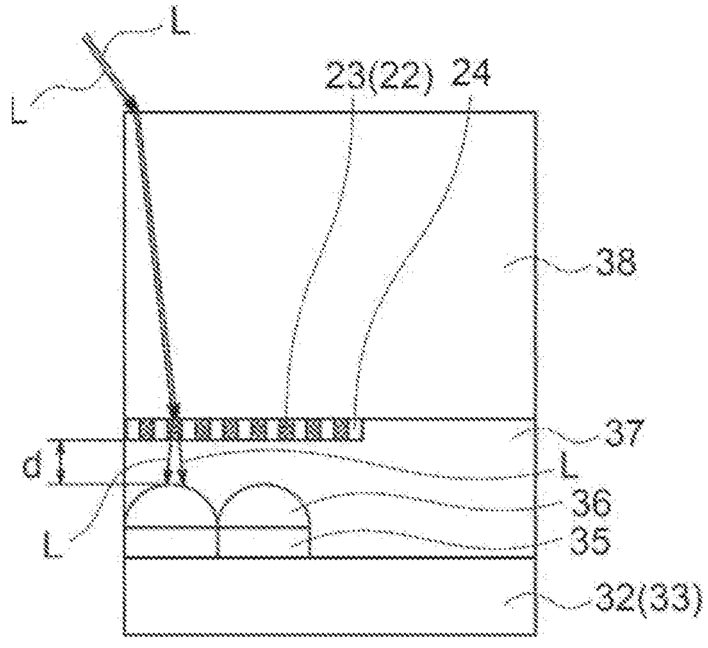
FIG. 10 is an enlarged cross-sectional view illustrating a part of the imaging element, and is a view for illustratively explaining a case where imaging light is refracted toward an appropriate image sensor by a diffractive lens, and color mixing is prevented.

FIG. 9 is an enlarged cross-sectional view of a part of the imaging element 11, and is a view for illustratively explaining a case where color mixing occurs between adjacent image sensors 40. FIG. 10 is an enlarged cross-sectional view illustrating a part of the imaging element 11, and is a view for illustratively explaining a case where the imaging light L is refracted toward an appropriate image sensor 40 by the diffractive lens 22, and color mixing is prevented.

As described above, according to the imaging element 11 of the present embodiment, the optical path of the imaging light L is changed by the geometric optical lens 21 and then is also changed by the diffractive lens 22.

However, the traveling direction of the imaging light L having passed through the diffractive lens 22 does not necessarily completely coincide with the direction perpendicular to the imaging surface of the image sensor 40 (that is, the optical axis direction). Although the traveling direction of the imaging light L is changed to approach the optical axis direction by the diffractive lens 22, the imaging light L includes a light component traveling in a direction oblique to the optical axis direction.

In a case where the distance between the diffractive lens 22 and the imaging surface of the image sensor 40 is large (see FIG. 9), the imaging light L traveling in a direction inclined with respect to the optical axis direction easily enters another image sensor 40 adjacent to the corresponding image sensor 40, and color mixing can be caused.

Meanwhile, in a case where the distance between the diffractive lens 22 and the imaging surface of the image sensor 40 is small (see FIG. 10), even if the imaging light L travels in a direction inclined with respect to the optical axis direction, the probability of entering the corresponding image sensor 40 increases, and color mixing is unlikely to occur.

The inventor of the present application has actually conducted studies on the occurrence of color mixing while changing the configuration of the imaging element 11, and resultantly found that it is effective that the diffractive lens 22 is located at a distance of 60 μm or less in the optical axis direction from the image sensor 40 (particularly, the imaging surface) from the viewpoint of preventing the occurrence of color mixing. The diffractive lens 22 is more preferably located at a distance of 50 μm or less, more preferably located at a distance of 40 μm or less, and still more preferably located at a distance of 30 μm or less in the optical axis direction from the image sensor 40.

Note that, in a case where the on-chip lens 36 is used as illustrated in FIGS. 9 and 10, the inventor of the present application has obtained knowledge that color mixing can be effectively prevented by setting the distance d in the optical axis direction between the diffractive lens 22 and the on-chip lens 36 (particularly, the top portion) to 60 μm or less. The distance d in the optical axis direction between the diffractive lens 22 and the on-chip lens 36 is more preferably 50 μm or less, more preferably 40 μm or less, and still more preferably 30 μm or less.

Next, an example of a method for manufacturing the diffractive lens 22 will be described.

FIGS. 11A to 11E are views for explaining an example of a method for manufacturing the diffractive lens 22. FIG. 12 is a perspective view illustrating a plurality of diffractive lenses 22 formed on a cover body wafer 45.

As described above, the diffractive lens 22 of the present embodiment is formed on the flat surface (particularly, on the back surface) of the cover body 38.

Figure 11A:
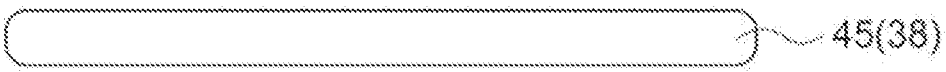
FIG. 11A is a view for explaining an example of a method for manufacturing a diffractive lens.
Figure 12:
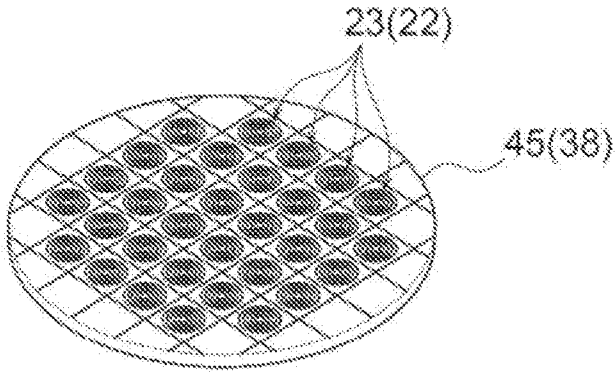
FIG. 12 is a perspective view illustrating a plurality of diffractive lenses formed on a cover body wafer.

In the present example, first, the cover body wafer 45 including a plurality of cover bodies 38 is prepared (see FIG. 11A).

The cover body wafer 45 has two flat surfaces located opposite to each other. These flat surfaces of the cover body wafer 45 correspond to the front and back surfaces of the individual cover bodies 38, respectively. A constituent material of the cover body wafer 45 (that is, the cover body 38) is not limited, and the cover body wafer 45 is constituted by, for example, glass.

Figure 11B:
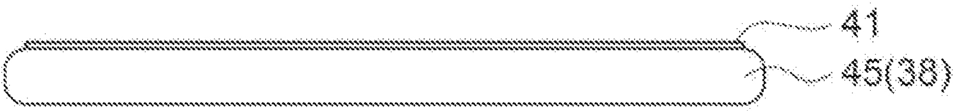
FIG. 11B is a view for explaining an example of the method for manufacturing the diffractive lens.

Then, the lens substrate film 41 constituted by the constituent material of the diffractive lens 22 is attached to one flat surface of the cover body wafer 45 (see FIG. 11B).

The constituent material of the lens substrate film 41 is not limited. Typically, the lens substrate film 41 is provided as a transparent inorganic film constituted by an inorganic material (for example, SiN, $ZrO_2$, ZnSe, Zns, $TiO_2$, $CeO_2$, or the like) having a high refractive index.

A method of attaching the lens substrate film 41 to the cover body wafer 45 is not limited, and the lens substrate film 41 is attached to the cover body wafer 45 using an arbitrary means (for example, application such as spin coater or spraying).

The thickness of the lens substrate film 41 on the cover body wafer 45 is not limited, but the thickness of the lens substrate film 41 on the cover body wafer 45 is determined according to the thickness of the diffractive lens 22 (that is, the plurality of protruding lens portions 23). Typically, the lens substrate film 41 having a thickness of several tens of nanometers (nm) to several hundred nm is formed on the cover body wafer 45.

Figure 11C:
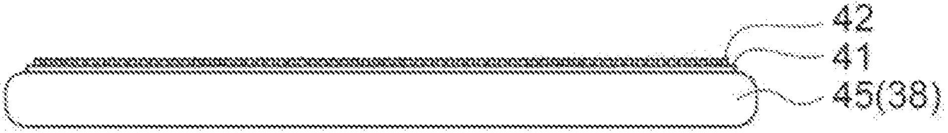
FIG. 11C is a view for explaining an example of the method for manufacturing the diffractive lens.

Thereafter, a resist 42 is attached onto the lens substrate film 41, and patterning is performed (see FIG. 11C). That is, the lens substrate film 41 is covered with the resist 42 having a pattern configuration corresponding to the shape and arrangement of the diffractive lens 22 (that is, the plurality of protruding lens portions 23).

The constituent material of the resist 42 and the method of attaching the resist 42 to the lens substrate film 41 are not limited.

Figure 11D:
FIG. 11D is a view for explaining an example of the method for manufacturing the diffractive lens.

Thereafter, the lens substrate film 41 is etched, and a portion of the lens substrate film 41 that is not covered with the resist 42 is removed from the cover body wafer 45 (FIG. 11D). A specific method of etching performed here is not limited, and dry etching is typically performed.

Figure 11E:
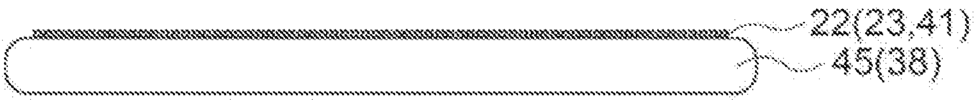
FIG. 11E is a view for explaining an example of the method for manufacturing the diffractive lens.

Thereafter, the resist 42 is removed from the lens substrate film 41 (FIG. 11E). A method of removing the resist 42 is not limited. Typically, the resist 42 is removed using chemicals selected according to the materials of the lens substrate film 41 and the resist 42.

As a result of performing the above-described series of steps, the plurality of diffractive lenses 22 (that is, the plurality of protruding lens portions 23) configured by the remaining lens substrate film 41 is formed on the cover body wafer 45 (see FIG. 12).

According to the above-described manufacturing method illustrated in FIGS. 11A to 11E, the diffractive lens 22 can be formed not on a curved surface but on a flat surface.

In order to efficiently refract the imaging light L using diffraction, the diffractive lens 22 needs to have a slit portion sufficiently small with respect to the wavelength of the imaging light L, and the individual protruding lens portions 23 may have a fine structure of several tens nm level. in a case where the fine protruding lens portion 23 at a level of several tens of nanometers is formed on a curved surface such as a lens surface by using a lithography etching technique, precise adjustment of a height direction position of the protruding lens portion 23 is required. It is not easy to form the diffractive lens 22 (the plurality of protruding lens portions 23) having such a fine structure on a curved surface with high accuracy, and the manufacturing cost increases.

On the other hand, in a case where the diffractive lens 22 is formed on the cover body 38 (cover body wafer 45) as in the present embodiment, the plurality of protruding lens portions 23 can be formed on the surface of the cover body 38 (cover body wafer 45) having high flatness. Therefore, the diffractive lens 22 having a fine structure of several tens nm level can be formed in advance on the flat surface of the cover body 38 (cover body wafer 45) with high accuracy by a lithography etching technique.

In addition, according to the above-described manufacturing method illustrated in FIGS. 11A to 11E, as illustrated in FIG. 12, the plurality of diffractive lenses 22 can be formed on the cover body wafer 45 having an integrated configuration including the plurality of cover bodies 38. That is, a plurality of diffractive lenses 22 can be simultaneously formed on a plurality of places corresponding to the respective cover bodies 38 in the cover body wafer 45. As a result, it is possible to efficiently manufacture a large amount of cover body 38 to which diffractive lens 22 is attached, and it is also possible to reduce manufacturing cost.

Note that the above-described cover body wafer 45 to which the plurality of diffractive lenses 22 is attached may be used for manufacturing the imaging element 11 in a state of an integrated wafer, or may be cut and separated into individual cover bodies 38.

Next, an example of a method for manufacturing the imaging element 11 will be described.

A typical example of the method for manufacturing the imaging element 11 includes a step of fixing the cover body 38 formed as described above to the pixel substrate 33. In this step, the cover body 38 is fixed to the pixel substrate 33 such that the diffractive lens 22 (that is, the plurality of protruding lens portions 23) attached to the cover body 38 is located between the cover body 38 and the pixel substrate 33.

In general, the color filter 35 and the on-chip lens 36 are often already attached to the pixel substrate 33 immediately before the cover body 38 is attached, and the color filter 35 and the on-chip lens 36 are often constituted by an organic material. Therefore, the pixel substrate 33 immediately before the cover body 38 is attached is strictly restricted in terms of heat resistance.

Therefore, it is possible to form the diffractive lens 22 on the pixel substrate 33 immediately before the cover body 38 is attached only within such a restriction range of heat resistance, and it is not necessarily easy.

Meanwhile, in a case where the diffractive lens 22 is formed on the cover body 38 separated from the pixel substrate 33 as described above, the restriction on heat resistance is relaxed, and the diffractive lens 22 can be formed on the surface of the cover body 38 having high flatness. Therefore, the diffractive lens 22 having a nano-level structure can be easily and accurately formed on the cover body 38 using a lithography etching technique.

Note that, in the imaging element 11 of the present embodiment, the cover body 38 is fixed to the pixel substrate 33 in a state where the air gap 24 is secured between the protruding lens portions 23 as described above.

In order to reliably create such an air gap 24, the method for manufacturing the imaging element 11 may include, for example, the following steps.

FIGS. 13A to 13D are perspective views illustrating an example of a method for manufacturing the imaging element 11.

Figure 14:
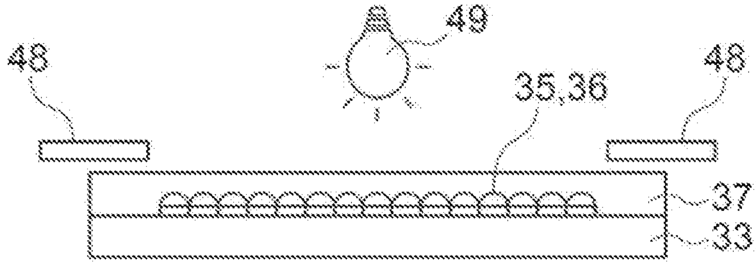
FIG. 14 is a cross-sectional view of the imaging element illustrating an example of a method for manufacturing the imaging element.
Figure 15:
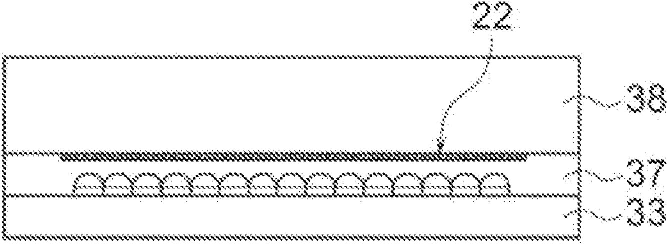
FIG. 15 is a cross-sectional view of the imaging element illustrating an example of a method for manufacturing the imaging element.
Figure 16:
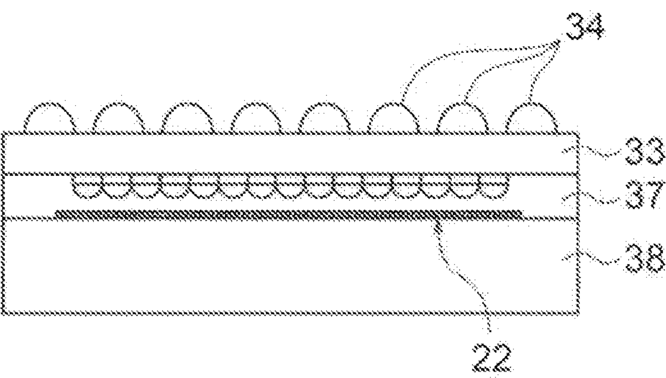
FIG. 16 is a cross-sectional view of the imaging element illustrating an example of a method for manufacturing the imaging element.

FIGS. 14 to 16 are cross-sectional views of the imaging element 11 illustrating an example of a method for manufacturing the imaging element 11. For easy understanding, FIGS. 14 to 16 focus on one pixel substrate 33, but in the manufacturing method of the present example, the manufacturing processes illustrated in FIGS. 14 to 16 are performed in units of a substrate wafer 46 including a plurality of pixel substrates 33.

In the imaging element 11 manufactured by the manufacturing method of the present example, the sealing resin 37 located between the pixel substrate 33 (in particular, the image sensor 40) and the diffractive lens 22 is constituted by a photocurable resin film, and the distal end portions of the plurality of protruding lens portions 23 are in contact with the photocurable resin film in the cured state.

Figure 13A:
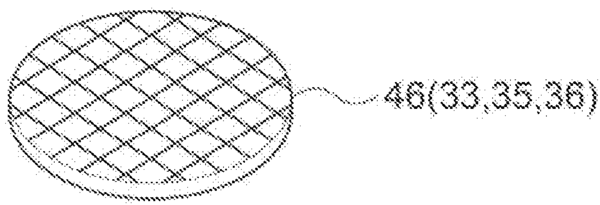
FIG. 13A is a perspective view illustrating an example of a method for manufacturing the imaging element.

That is, first, the integrally configured substrate wafer 46 including the plurality of pixel substrates 33 is prepared (see FIG. 13A). The color filter 35 and the on-chip lens 36 are already attached to the substrate wafer 46 at positions corresponding to the respective pixel substrates 33.

Figure 13B:
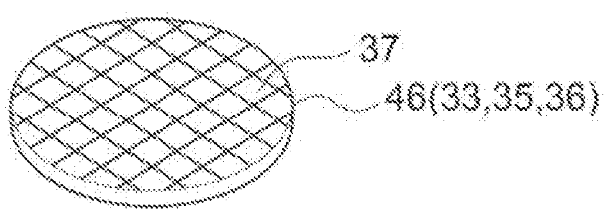
FIG. 13B is a perspective view illustrating an example of the method for manufacturing the imaging element.

Then, a photocurable resin constituting the sealing resin 37 is applied in an uncured state on one surface of the substrate wafer 46 (that is, the plurality of pixel substrates 33) (see FIG. 13B). The photocurable resin is applied to the substrate wafer 46 so as to cover a surface of each pixel substrate 33 on a side where the color filter 35 and the on-chip lens 36 are provided.

Figure 13C:
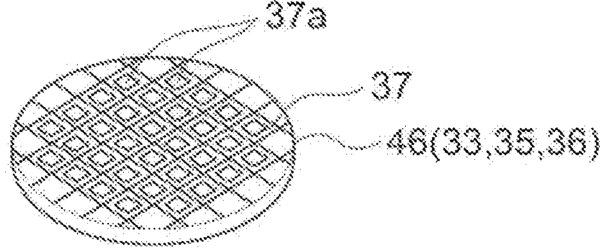
FIG. 13C is a perspective view illustrating an example of the method for manufacturing the imaging element.

Thereafter, the photocurable resin (sealing resin 37) on the substrate wafer 46 is irradiated with light (see FIG. 13C). As a result, a portion of the photocurable resin on the substrate wafer 46 covering the image sensor 40 of each pixel substrate 33 is cured by light irradiation (see "resin curing unit 37*a*" illustrated in FIG. 13C).

In this step, a portion of the photocurable resin on the substrate wafer 46 outside the image sensor 40 of each pixel substrate 33 is not irradiated with light and remains in an uncured state.

Typically, as illustrated in FIG. 14, light emitted from the exposure device 49 is irradiated to the photocurable resin (sealing resin 37) on each pixel substrate 33 via the mask 48.

Figure 13D:
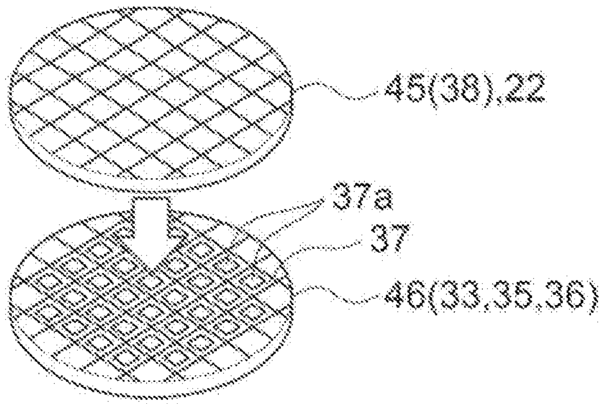
FIG. 13D is a perspective view illustrating an example of the method for manufacturing the imaging element.

Thereafter, the cover body wafer 45 (see FIG. 12) to which the diffractive lens 22 is attached is bonded to the substrate wafer 46 via the photocurable resin (sealing resin 37) (see FIG. 13D).

That is, an uncured portion (that is, an unexposed portion) of the photocurable resin (sealing resin 37) located outside the image sensor 40 functions as an adhesive, and bonds the cover body wafer 45 and the substrate wafer 46.

In this step, each cover body 38 of the cover body wafer 45 is fixed to the corresponding pixel substrate 33 while the diffractive lens 22 (that is, the plurality of protruding lens portions 23) faces a portion of the photocurable resin on each pixel substrate 33 of the substrate wafer 46 cured by light irradiation.

By pressing the cover body wafer 45 against the substrate wafer 46, an uncured portion of the photocurable resin rises higher than the on-chip lens 36 outside the image sensor 40. By bringing the portion outside the diffractive lens 22 in the back surface of the cover body 38 into contact with the photocurable resin in the uncured state raised in the peripheral portion of each pixel substrate 33 in this manner, each pixel substrate 33 is adhered to the corresponding cover body 38 (see FIG. 15).

In this step, the uncured portion of the photocurable resin (sealing resin 37) in contact with the cover body wafer 45 and the substrate wafer 46 is irradiated with light, and the photocurable resin (sealing resin 37) is fixed to the cover body wafer 45 and the substrate wafer 46.

Thereafter, components such as solder balls 34, TSVs, and backside wires are formed into an integrated wafer structure including the cover body wafer 45 and the substrate wafer 46 (see FIG. 16).

The wafer structure is then cut and separated into individual imaging elements 11.

According to the manufacturing method of the present example, the plurality of protruding lens portions 23 is brought into contact with the sealing resin 37 in a state where a portion of the sealing resin 37 facing the diffractive lens 22 (that is, the plurality of protruding lens portions 23) is cured.

Therefore, the cover body 38 to which the diffractive lens 22 is attached can be pressed against and fixed to the pixel substrate 33 via the sealing resin 37 while preventing the sealing resin 37 from entering the air gap 24 between the protruding lens portions 23.

Therefore, each air gap 24 can maintain the state of the space without being filled with the sealing resin 37, and the diffractive lens 22 can maintain desired optical characteristics.

Figure 17:
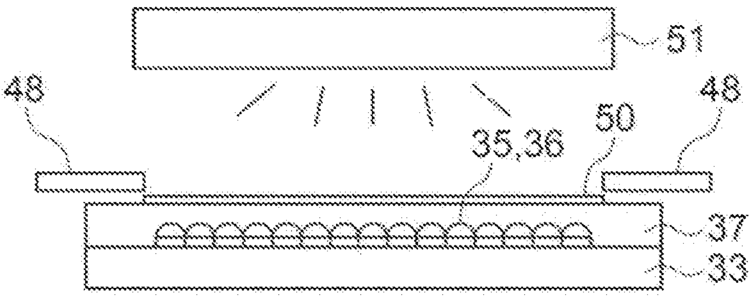
FIG. 17 is a cross-sectional view illustrating another example of the method for manufacturing the imaging element.
Figure 18:
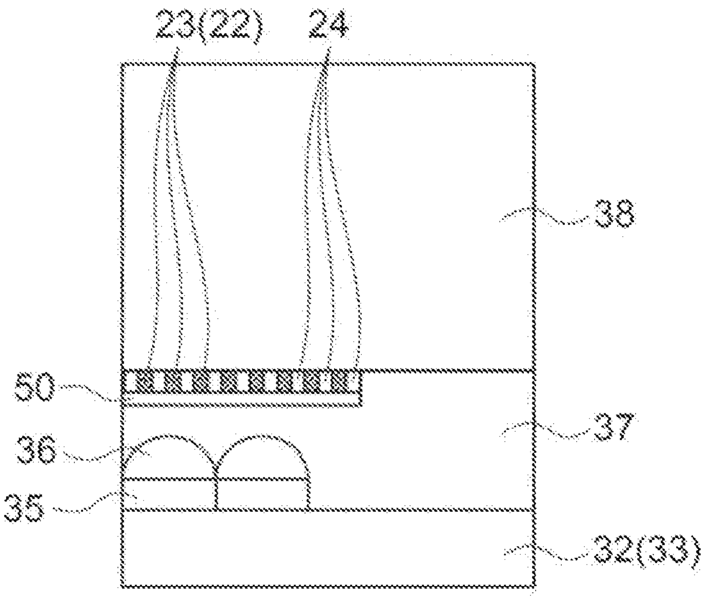
FIG. 18 is an enlarged cross-sectional view illustrating a part of the imaging element manufactured by the manufacturing method illustrated in FIG. 17.

FIG. 17 is a cross-sectional view illustrating another example of the method for manufacturing the imaging element 11. FIG. 18 is an enlarged cross-sectional view illustrating a part of the imaging element 11 manufactured by the manufacturing method illustrated in FIG. 17.

In the imaging element 11 manufactured by the manufacturing method of the present example, the distal end portions of the plurality of protruding lens portions 23 are in contact with an inorganic film 50 located between the pixel substrate 33 (particularly, the image sensor 40) and the diffractive lens 22.

That is, first, the substrate wafer 46 to which the color filter 35 and the on-chip lens 36 are already attached is prepared.

Then, a material film constituting the sealing resin 37 is applied onto one surface of the substrate wafer 46 (that is, the plurality of pixel substrates 33). A specific material of the sealing resin 37 is not limited, and may be a photocurable resin or a thermosetting resin.

Then, the sealing resin 37 on the substrate wafer 46 is semi-cured. The method for semi-curing the sealing resin 37 is not limited, and the sealing resin 37 is semi-cured by an appropriate means such as light irradiation or heating.

Thereafter, the transmissive inorganic film 50 is applied on the semi-cured sealing resin 37 on the substrate wafer 46 (that is, the plurality of pixel substrates 33). As a result, the image sensor 40 of each pixel substrate 33 of the substrate wafer 46 is covered with the cured inorganic film 50.

Note that a portion of the sealing resin 37 on the substrate wafer 46 outside the image sensor 40 of each pixel substrate 33 is not covered with the inorganic film 50 and remains exposed in a semi-cured state.

A specific material of the inorganic film 50 is not limited, and the inorganic film 50 may be constituted by, for example, silicon dioxide ($SiO_2$).

A method of applying the inorganic film 50 to the sealing resin 37 is not limited, and for example, the inorganic film 50 can be attached to the sealing resin 37 by sputtering. As an example, as illustrated in FIG. 17, a mask 48 is interposed between the sealing resin 37 on the pixel substrate 33 and a film forming device 51, and the film forming device 51 performs the film forming processing of the inorganic film 50 in a state where a range where the inorganic film 50 is formed in the sealing resin 37 is exposed to the film forming device 51.

Thereafter, the cover body wafer 45 (see FIG. 12) to which the diffractive lens 22 is attached is bonded to the substrate wafer 46 via the sealing resin 37. In this step, the cover body 38 is fixed to the pixel substrate 33 while the plurality of protruding lens portions 23 faces the inorganic film 50.

By pressing the cover body wafer 45 against the substrate wafer 46, an uncured portion of the sealing resin 37 rises higher than the on-chip lens 36 outside the image sensor 40. By bringing the portion outside the diffractive lens 22 in the back surface of the cover body 38 into contact with the sealing resin 37 in the uncured state raised in the peripheral portion in this manner, each pixel substrate 33 is adhered to the corresponding cover body 38 (see FIG. 18).

In this step, an uncured portion of the sealing resin 37 in contact with the cover body wafer 45 and the substrate wafer 46 is cured, and the sealing resin 37 is fixed to the cover body wafer 45 and the substrate wafer 46.

Thereafter, components such as solder balls 34, TSVs, and backside wires are formed into an integrated wafer structure including the cover body wafer 45 and the substrate wafer 46.

The wafer structure is then cut and separated into individual imaging elements 11.

According to the manufacturing method of the present example, when the cover body 38 is fixed to the pixel substrate 33, the plurality of protruding lens portions 23 is brought into contact with the inorganic film 50 in the cured state.

Therefore, in a state where the entry of the sealing resin 37 into the air gap 24 between the protruding lens portions 23 is blocked by the inorganic film 50, the cover body 38 to which the diffractive lens 22 is attached can be pressed against and fixed to the pixel substrate 33 via the sealing resin 37.

Therefore, each air gap 24 can maintain the state of the space without being filled with the sealing resin 37, and the diffractive lens 22 can maintain desired optical characteristics.

In any of the above-described manufacturing methods, the cover body 38 is pressed against the pixel substrate 33 via the sealing resin 37 in a state where the plurality of protruding lens portions 23 of the diffractive lens 22 faces the curing member (that is, the sealing resin 37 (photocurable resin) or the inorganic film 50). As a result, it is possible to reliably prevent the sealing resin 37 from entering the air gap 24 between the protruding lens portions 23, and the diffractive lens 22 can exhibit original optical characteristics while maintaining the minute uneven shape.

Second Embodiment

In the present embodiment, elements that are the same as or correspond to those in the above-described first embodiment described above are denoted by the same reference numerals, and the detailed description thereof will be omitted.

Figure 19:
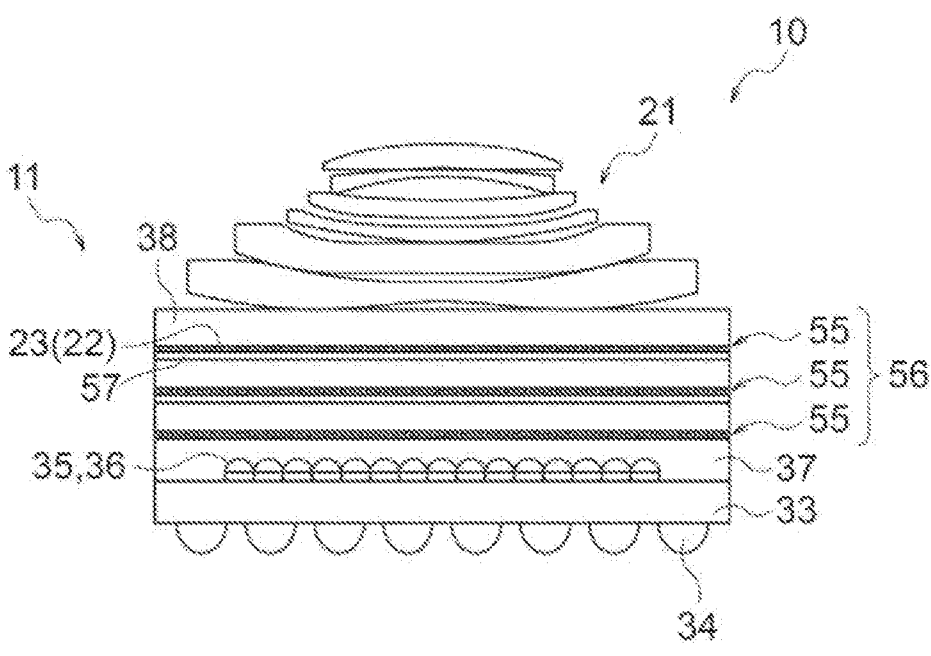
FIG. 19 is a cross-sectional view illustrating an example of an imaging device according to a second embodiment.

FIG. 19 is a cross-sectional view illustrating an example of an imaging device 10 according to a second embodiment.

The imaging device 10 illustrated in FIG. 19 includes a diffractive lens unit 56 including a plurality of lens constituent layers 55.

The plurality of lens constituent layers 55 overlaps each other in the optical axis direction. Each lens constituent layer 55 includes the cover body 38 and the diffractive lens 22 (the plurality of protruding lens portions 23) attached to the back surface of the cover body 38.

The diffractive lens unit 56 illustrated in FIG. 19 includes three lens constituent layers 55, but the number of lens constituent layers 55 included in the diffractive lens unit 56 is not limited.

Adjacent lens constituent layers 55 are adhered to each other via adhesive layers 57. That is, the diffractive lens 22 of one lens constituent layer 55 (upper lens constituent layer 55 in FIG. 19) of the adjacent lens constituent layers 55 and the cover body 38 (particularly the surface) of the other lens constituent layer 55 (lower lens constituent layer 55 in FIG. 19) are fixed to the same adhesive layer 57.

Of the diffractive lens 22 (the plurality of protruding lens portions 23) of the lens constituent layer 55 located closest to the pixel substrate 33 side (the lower side in FIG. 19), a portion that does not face the image sensor 40 adheres to the pixel substrate 33 via the sealing resin 37.

In the example illustrated in FIG. 19, the diffractive lens 22 is attached to the entire back surface of each cover body 38, but the diffractive lens 22 may be attached only to a part of the back surface of each cover body 38 as in the above-described example of the first embodiment (see FIG. 4). In this case, the adhesive layer 57 and the sealing resin 37 may be provided so as to adhere to a peripheral region of the back surface of the cover body 38 to which the diffractive lens 22 is not attached, and so as not to adhere to a central region of the back surface of the cover body 38 to which the diffractive lens 22 is attached.

Other configurations of the imaging device 10 illustrated in FIG. 19 are similar to those of the imaging device 10 according to the first embodiment described above.

According to the imaging device 10 and the imaging element 11 of the present embodiment, it is possible to adjust the optical path of the imaging light L by the plurality of diffractive lenses 22 having the stacked structure and to improve a defect in optical characteristics such as chromatic aberration.

As a result, for example, it is possible to realize the imaging device 10 and the imaging element 11 having more advanced optical characteristics, and to use a simpler and/or cheaper geometric optical lens 21. In particular, by reducing the number of lenses of the geometric optical lens 21 and the thickness of each lens, it is possible to reduce the size of the entire optical lens system in the optical axis direction and to promote thinning of the entire imaging device 10.

In addition, by using the diffractive lens 22 having various optical characteristics in each lens constituent layer 55, various optical characteristics can be exhibited as the entire optical lens system.

Third Embodiment

In the present embodiment, elements that are the same as or correspond to those in the first embodiment and the second embodiment described above are denoted by the same reference numerals, and the detailed description thereof will be omitted.

Figure 20:
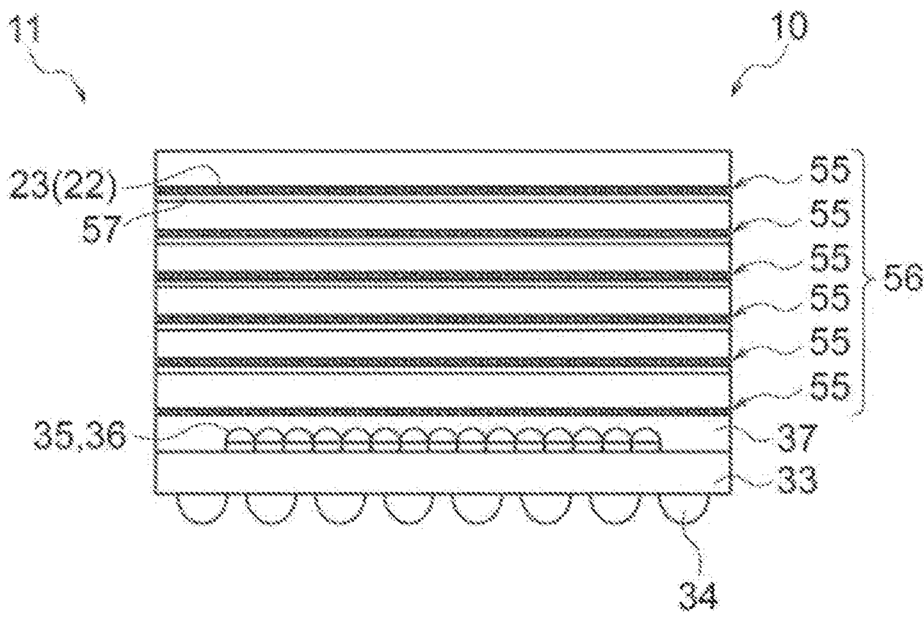
FIG. 20 is a cross-sectional view illustrating an example of an imaging device according to a third embodiment.

FIG. 20 is a cross-sectional view illustrating an example of an imaging device 10 according to a third embodiment.

The imaging device 10 illustrated in FIG. 20 includes the diffractive lens unit 56 including the plurality of lens constituent layers 55, but does not include a geometric optical lens. That is, the optical lens system of the present embodiment includes only the plurality of diffractive lenses 22 and does not include the geometric optical lens. The diffractive lens unit 56 illustrated in FIG. 20 includes six lens constituent layers 55.

The adhesion configuration between the adjacent lens constituent layers 55 and the adhesion configuration between the lens constituent layer 55 located closest to the pixel substrate 33 side and the pixel substrate 33 are similar to those in the example of the second embodiment described above (see FIG. 19).

Other configurations of the imaging device 10 illustrated in FIG. 20 are similar to those of the imaging device 10 according to the second embodiment described above.

According to the imaging device 10 and the imaging element 11 of the present embodiment, the geometric optical lens is unnecessary. Therefore, the device configuration can be simplified, and the size in the optical axis direction of the entire imaging device 10 can be reduced.

In addition, by using the diffractive lens 22 having various optical characteristics in each lens constituent layer 55, various optical characteristics can be exhibited as the entire optical lens system.

Fourth Embodiment

In the present embodiment, elements that are the same as or correspond to those in the first to third embodiments described above are denoted by the same reference numerals, and the detailed description thereof will be omitted.

Figure 21:
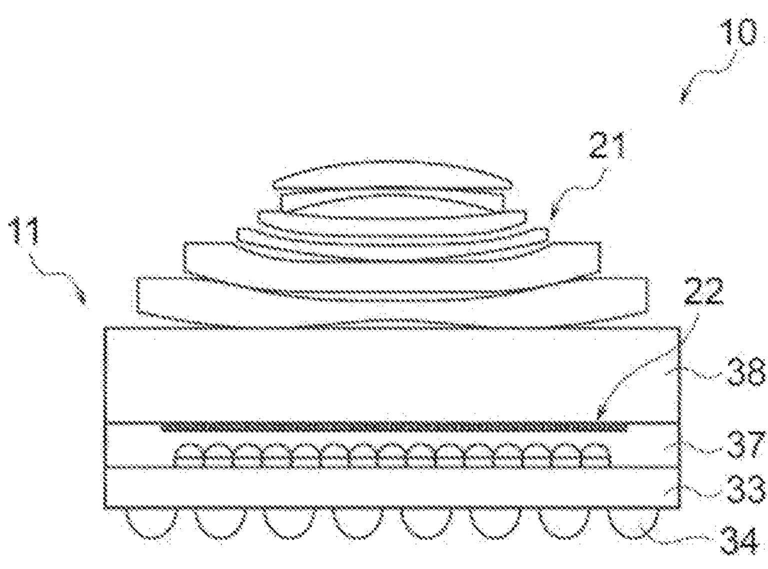
FIG. 21 is a cross-sectional view illustrating an example of an imaging device according to a fourth embodiment.

FIG. 21 is a cross-sectional view illustrating an example of an imaging device 10 according to a fourth embodiment.

In the imaging element 11 illustrated in FIG. 21, the air gap 24 between the protruding lens portions 23 constituting the diffractive lens 22 is filled with the sealing resin 37.

Similarly to the above-described first embodiment, the diffractive lens 22 of the present embodiment exists over a range facing the image sensor 40 in the optical axis direction in the back surface of the cover body 38, but does not exist in a part or all of a peripheral range not facing the image sensor 40 in the back surface of the cover body 38.

Other configurations of the imaging device 10 of the present example are similar to those of the imaging device 10 according to the first embodiment described above.

Also in the imaging device 10 and the imaging element 11 of the present embodiment, the diffractive lens 22 (the plurality of protruding lens portions 23) is attached to the flat surface of the cover body 38. Therefore, the diffractive lens

22 having a desired shape can be accurately provided at a desired position on the cover body 38.

Fifth Embodiment

In the present embodiment, elements that are the same as or correspond to those in the first to fourth embodiments described above are denoted by the same reference numerals, and the detailed description thereof will be omitted.

Figure 22:
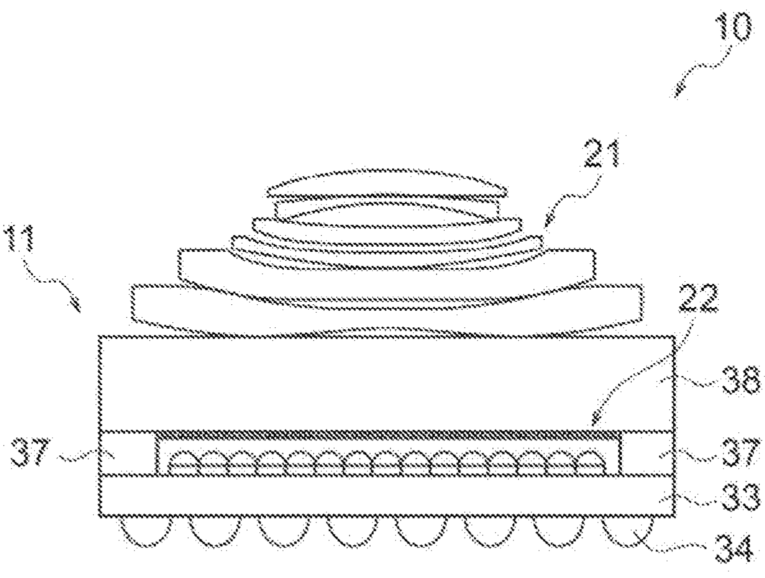
FIG. 22 is a cross-sectional view illustrating an example of an imaging device according to a fifth embodiment.

FIG. 22 is a cross-sectional view illustrating an example of an imaging device 10 according to a fifth embodiment.

In the imaging element 11 illustrated in FIG. 22, a space is provided between the image sensor 40 and the diffractive lens 22. More specifically, in the optical axis direction, the sealing resin 37 does not exist and a space exists between the on-chip lens 36 and the diffractive lens 22 (the plurality of protruding lens portions 23).

That is, in the range corresponding to the peripheral region of the pixel substrate 33, similarly to the above-described first embodiment, there is the sealing resin 37 that adheres and fixes the cover body 38 to the pixel substrate 33. Meanwhile, the sealing resin 37 does not exist in a range corresponding to the central region of the pixel substrate 33 (particularly, a region where the image sensor 40 exists).

Therefore, the imaging element 11 of the present example has a cavity structure having a space surrounded by the cover body 38, the sealing resin 37, and the pixel substrate 33, and the color filter 35, the on-chip lens 36, and the diffractive lens 22 are located in the space.

Other configurations of the imaging device 10 illustrated in FIG. 22 are similar to those of the imaging device 10 according to the first embodiment described above.

According to the imaging device 10 and the imaging element 11 of the present embodiment, since there is a large refractive index difference between the diffractive lens 22 and the space adjacent to the diffractive lens 22, it is possible to improve the diffraction performance (that is, the refraction performance) of the diffractive lens 22. As a result, it is possible to relax restrictions on the design of the geometric optical lens 21 and the diffractive lens 22.

Sixth Embodiment

In the present embodiment, elements that are the same as or correspond to those in the first to fifth embodiments described above are denoted by the same reference numerals, and the detailed description thereof will be omitted.

Figure 23:
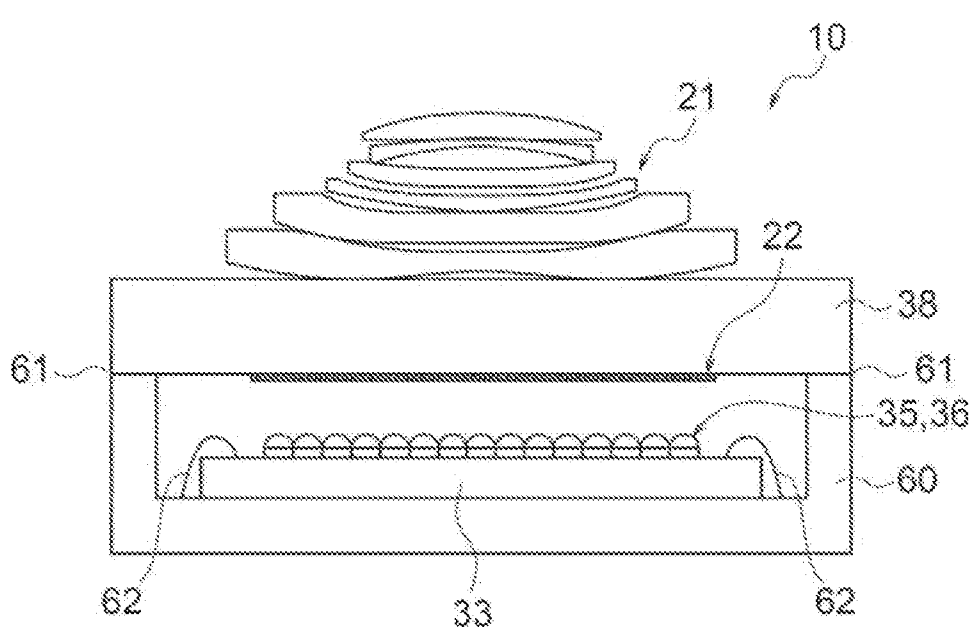
FIG. 23 is a cross-sectional view illustrating an example of an imaging device according to a sixth embodiment.

FIG. 23 is a cross-sectional view illustrating an example of an imaging device 10 according to a sixth embodiment.

An imaging element 11 illustrated in FIG. 23 includes a support body 60 that supports the pixel substrate 33 from the outside, and an adhesive layer 61 located between the support body 60 and the cover body 38.

The support body 60 has a hollow structure having a space inside, and includes a support bottom portion extending in a direction perpendicular to the optical axis Ax and a support peripheral edge portion extending from the support bottom portion in the optical axis direction.

The pixel substrate 33, the color filter 35, and the on-chip lens 36 are fixed to the support bottom portion, and the entire pixel substrate, the color filter, and the on-chip lens are arranged in the inner space of the support body 60.

The entire diffractive lens 22 attached to the back surface of the cover body 38 is disposed in a space surrounded by the support body 60, the adhesive layer 61, and the cover body 38.

The adhesive layer 61 is located between the end surface of the support peripheral edge portion of the support body 60 and the back surface of the peripheral edge portion of the cover body 38 (particularly, a portion located outside the diffractive lens 22), and serves as a fixing portion that fixes the cover body 38 to the support body 60.

Therefore, in the imaging element 11 of the present embodiment, the sealing resin 37 provided in the imaging elements 11 of the first to fourth embodiments described above is unnecessary. Therefore, a space exists between the on-chip lens 36 and the diffractive lens 22 (the plurality of protruding lens portions 23) over the entire area.

The pixel substrate 33 is connected to an external substrate (not illustrated) via the wire bond wiring 62. The entire wire bond wiring 62 and the portion of the external substrate to which the wire bond wiring 62 is connected are located in the inner space of the support body 60.

Other configurations of the imaging device 10 illustrated in FIG. 23 are similar to those of the imaging device 10 according to the first embodiment described above.

According to the imaging device 10 and the imaging element 11 of the present embodiment, since there is a large refractive index difference between the diffractive lens 22 and the space adjacent to the diffractive lens 22, it is possible to improve the diffraction performance (that is, the refraction performance) of the diffractive lens 22.

Furthermore, since the pixel substrate 33 is supported from the outside by the support body 60, it is possible to prevent the occurrence of deflection and warpage of the pixel substrate 33.

[Structural Example of Diffractive Lens]

Next, a structural example of the diffractive lens 22 will be described.

The imaging device 10 and the imaging element 11 to which the diffractive lens 22 described below as an example can be applied are not limited. Therefore, the diffractive lens 22 described below may be applied to the imaging device 10 and the imaging element 11 according to each of the above-described embodiments, or may be applied to other imaging devices 10 and imaging elements 11.

Figure 24:
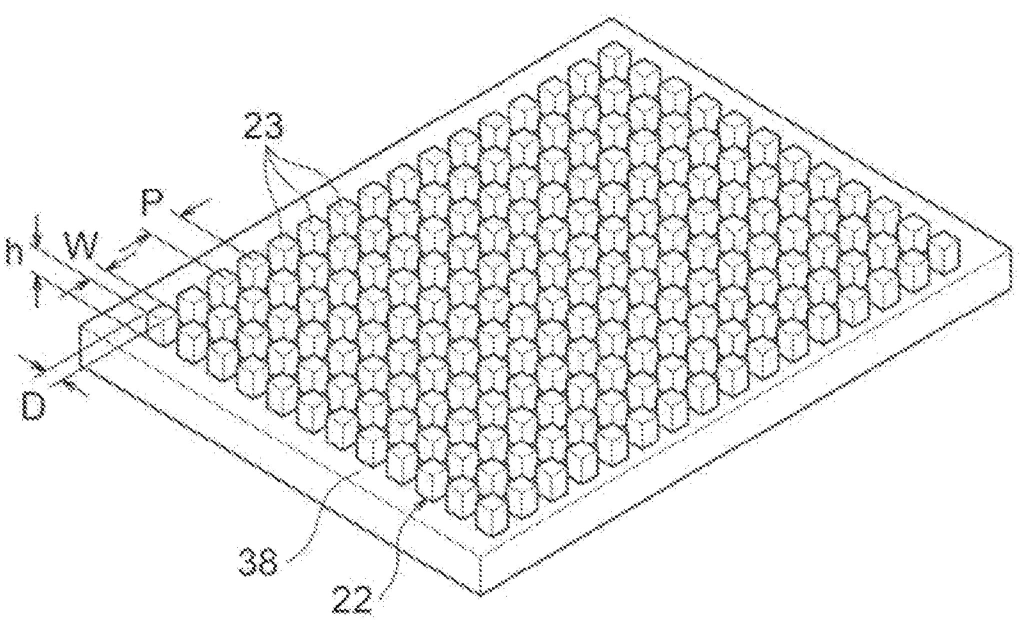
FIG. 24 is a perspective view illustrating a structural example of a diffractive lens.

FIG. 24 is a perspective view illustrating a structural example of the diffractive lens 22. For easy understanding, FIG. 24 illustrates a state in which a plurality of protruding lens portions 23 is regularly arranged along the longitudinal direction and the lateral direction perpendicular to each other on the upper surface of the rectangular parallelepiped cover body 38. Actual states of the cover body 38 and the diffractive lens 22 (the plurality of protruding lens portions 23) may be different from the state illustrated in FIG. 24.

The structure of the diffractive lens 22 is mainly determined according to the size (height h) of each protruding lens portion 23 in the optical axis direction, the distance (pitch P) between the adjacent protruding lens portions 23, and the size (vertical width D and horizontal width W) in the direction perpendicular to the optical axis Ax.

In order to appropriately refract the imaging light L, the diffractive lens 22 needs to have a slit sufficiently small with respect to the wavelength of the imaging light L.

In a case of assuming use in a general imaging device 10 (camera), each of the protruding lens portions 23 has a height h of about 200 to 1000 nm, a vertical width D and a horizontal width W of about 100 to 800 nm, and a pitch P of about 300 to 800 nm.

Figure 25:
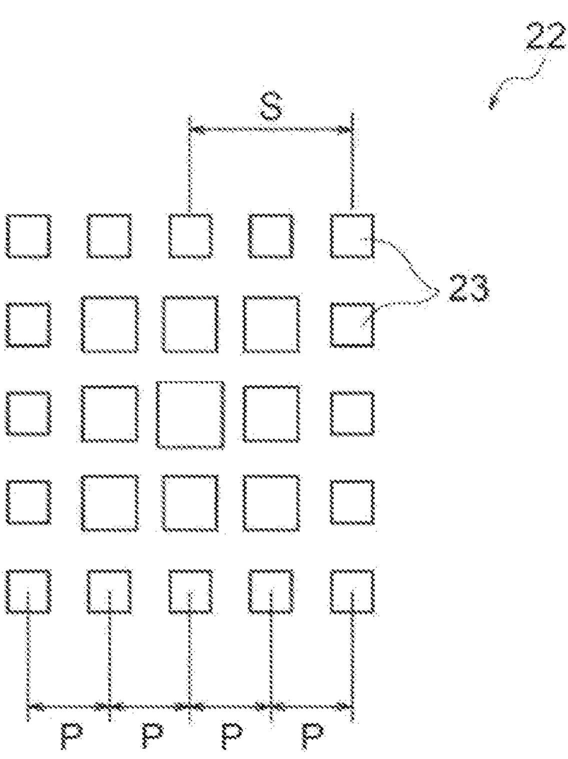
FIG. 25 is an enlarged plan view schematically illustrating an example of a diffractive lens.
Figure 26A:
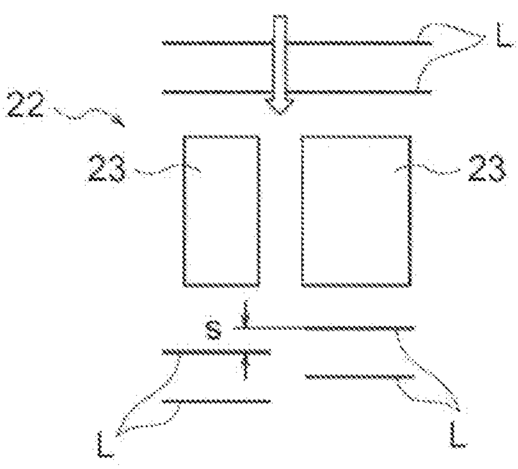
FIG. 26A is a view for explaining a phase difference of light diffraction of a diffractive lens (a plurality of protruding lens portions).
Figure 26B:
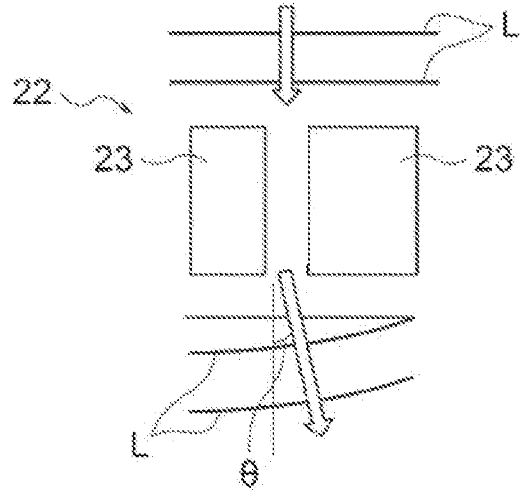
FIG. 26B is a view for explaining a refraction angle of light diffraction of the diffractive lens (the plurality of protruding lens portions).
Figure 26C:
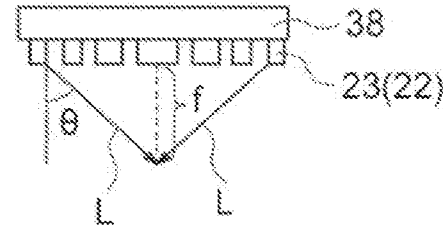
FIG. 26C is a view for explaining a refraction angle and a focal length of light diffraction of the diffractive lens (the plurality of protruding lens portions).

FIG. 25 is an enlarged plan view schematically illustrating an example of the diffractive lens 22. FIGS. 26A to 26C are views for explaining a phase difference s, a refraction angle θ, and a focal length f of light diffraction of the diffractive lens 22 (the plurality of protruding lens portions 23).

In the example illustrated in FIG. 25, in a state where the pitch P of the protruding lens portions 23 is kept constant, the planar size (for example, the horizontal width W and the vertical width D) of the protruding lens portions 23 decreases from the center toward the outside. In this case, a phase difference s occurs in the imaging light L diffracted by the diffractive lens 22 (see FIG. 26A), and the imaging light L emitted from the protruding lens portion 23 is refracted (see FIG. 26B).

In a case where the entire diffractive lens 22 functions as a convex lens, the diffractive lens 22 needs to refract the imaging light L at a larger refraction angle θ at a position farther from the optical axis Ax, and has a focal length f as illustrated in FIG. 26C.

Meanwhile, the phase difference s (see FIG. 26A) of the imaging light L provided by the protruding lens portion 23 gradually changes according to the number of the protruding lens portions 23 arranged from the center toward the outside, and a phase difference s of 360° occurs at a position away from the center by a certain distance.

Therefore, by continuously generating such a change in the phase difference s from the center (optical axis Ax) toward the outside, the entire diffractive lens 22 can be configured as a convex lens.

Figure 27:
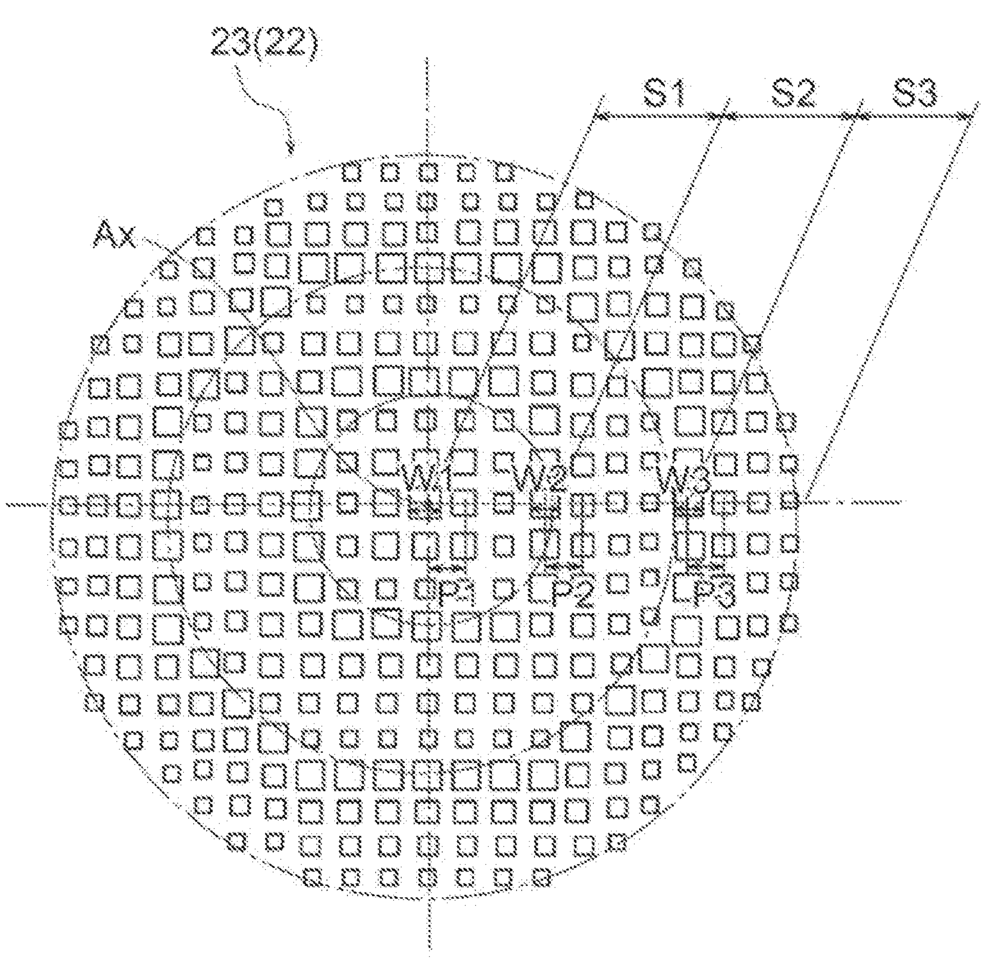
FIG. 27 is a plan view illustrating an arrangement example of a plurality of protruding lens portions constituting one diffractive lens.

FIG. 27 is a plan view illustrating an arrangement example of the plurality of protruding lens portions 23 constituting one diffractive lens 22.

As illustrated in FIG. 27, by periodically changing the planar size (for example, the horizontal width W and the vertical width D) of the protruding lens portion 23 from the center (that is, the optical axis Ax) toward the outside, it is possible to cause the entire diffractive lens 22 to function as a convex lens.

The diffractive lens 22 illustrated in FIG. 27 includes a protruding lens portion 23 having a first cycle S1, a second cycle S2, and a third cycle S3. The first cycle S1 is a range including the optical axis Ax. The second cycle S2 is a range next to the first cycle S1 and close to the optical axis Ax, and is located adjacent to the first cycle S1. The third cycle S3 is a range next to the second cycle S2 and close to the optical axis Ax, and is located adjacent to the second cycle S2.

The plurality of protruding lens portions 23 included in each of the first cycle S1, the second cycle S2, and the third cycle S3 exhibits a phase difference in a range of 0° to 360° with respect to light diffraction.

Here, in the example illustrated in FIG. 27, attention is paid to the plurality of protruding lens portions 23 located on an imaginary line extending in the right lateral direction from the center (optical axis Ax).

In this case, the horizontal width W1 of each protruding lens portion 23 included in the first cycle S1, the horizontal width W2 of each protruding lens portion 23 included in the second cycle S2, and the horizontal width W3 of each protruding lens portion 23 included in the third cycle S3 have a relationship of "W1>W2>W3". That is, the horizontal width W of the protruding lens portions 23 corresponding to each other in the cycle with respect to the position in each cycle satisfies the relationship of "W1>W2>W3".

For example, the horizontal width W1 of the protruding lens portion 23 located closest to the optical axis Ax side in the first cycle S1, the horizontal width W2 of the protruding lens portion 23 located closest to the optical axis Ax side in the second cycle S2, and the horizontal width W3 of the protruding lens portion 23 located closest to the optical axis Ax side in the third cycle S3 satisfy "W1>W2>W3".

Note that "W1>W2>W3" described above is a relationship satisfied in a case where attention is paid to the plurality of protruding lens portions 23 arranged in the direction of the horizontal width W of each protruding lens portion 23.

Regarding the relationship among the plurality of protruding lens portions 23 arranged in the other linear direction, the size J1 of each protruding lens portion 23 in the first cycle S1, the size J2 of each protruding lens portion 23 in the second cycle S2, and J3 of each protruding lens portion 23 in the third cycle S3 along the direction satisfy "J1>J2>J3". That is, the sizes of the protruding lens portions 23 corresponding to each other in the cycle with respect to the position in each cycle satisfy the relationship of "J1>J2>J3".

Therefore, in a case where attention is paid to the plurality of protruding lens portions 23 arranged in the direction of the vertical width D of each protruding lens portion 23, the relationship of "D1>D2>D3" is satisfied among the corresponding protruding lens portions 23 in the first cycle S1 to the third cycle S3. That is, the vertical width D1 of the protruding lens portion 23 closest to the optical axis Ax side in the first cycle S1, the second cycle S2 of the protruding lens portion 23 closest to the optical axis Ax side in the second cycle S2, and the vertical width D3 of the protruding lens portion 23 closest to the optical axis Ax side in the third cycle S3 satisfy the relationship of "D1>D2>D3".

Meanwhile, the plurality of protruding lens portions 23 in each cycle is provided at the same pitch P.

However, the pitch P1 of the protruding lens portions 23 included in the first cycle S1, the pitch P2 of the protruding lens portions 23 included in the second cycle S2, and the pitch P3 of the protruding lens portions 23 included in the third cycle S3 have a relationship of "P1>P2>P3".

The diffractive lens 22 satisfying "W1>W2>W3", "D1>D2>D3", "J1>J2>J3", and "P1>P2>P3" described above constitutes a convex lens as a whole.

Meanwhile, the diffractive lens 22 satisfying "W1<W2<W3", "D1<D2<D3", "J1<J2<J3", and "P1<P2<P3" constitutes a concave lens as a whole.

As described above, the planar sizes (that is, the sizes on the plane perpendicular to the optical axis Ax) of the plurality of protruding lens portions 23 of the diffractive lens 22 constituting the convex lens periodically change with reference to the distance from the optical axis Ax. The cycle of change in the planar size of the plurality of protruding lens portions 23 is based on a phase difference of 360° of light diffraction of the plurality of protruding lens portions 23. Then, in the diffractive lens 22 forming the convex lens, the planar size of the protruding lens portion 23 decreases as it goes away from the optical axis Ax in each cycle.

Similarly, the planar sizes of the plurality of protruding lens portions 23 of the diffractive lens 22 constituting the concave lens periodically change with reference to the distance from the optical axis Ax, and the cycle of change in the planar sizes of the plurality of protruding lens portions 23 is based on a phase difference of 360° of light diffraction of the plurality of protruding lens portions 23. However, in the diffractive lens 22 forming the concave lens, the planar size of the protruding lens portion 23 increases as the distance from the optical axis Ax increases in each cycle.

APPLICATION EXAMPLES

Hereinafter, an example of an electronic device to which the imaging device 10, the imaging element 11, and the methods for manufacturing the imaging device 10 and the imaging element 11 described above can be applied will be described. Note that the imaging device 10, the imaging element 11, and the methods for manufacturing the imaging device 10 and the imaging element 11 described above can also be applied to any system, device, method, and the like other than the electronic device described below.

<Application Example to Moving Body>

The technology according to an embodiment of the present disclosure (present technology) can be applied to various products. For example, the technology according to the present disclosure may be implemented as a device mounted on any type of moving body such as an automobile, an electric vehicle, a hybrid electric automobile, a motorcycle, a bicycle, a personal mobility, an airplane, a drone, a ship, a robot, and the like.

Figure 28:
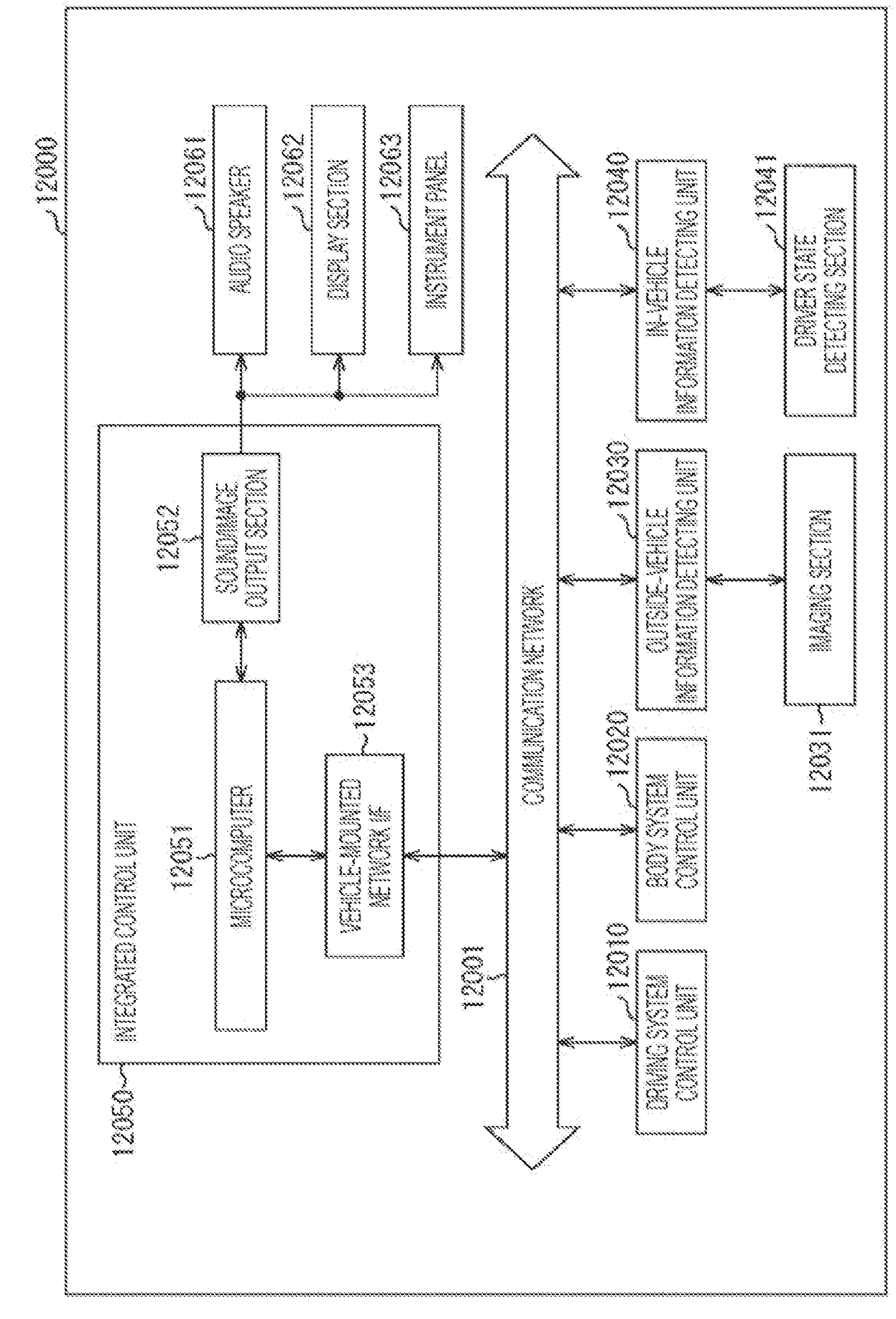
FIG. 28 is a block diagram illustrating an example of a schematic configuration of a vehicle control system.

FIG. 28 is a block diagram illustrating a schematic configuration example of a vehicle control system as an example of a moving body control system to which the technology according to an embodiment of the present disclosure can be applied.

The vehicle control system 12000 includes a plurality of electronic control units connected to each other via a communication network 12001. In the example depicted in FIG. 28, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example in FIG. 28, as the output device, an audio speaker 12061, a display section 12062, and an instrument panel 12063 are illustrated. The display section 12062 may, for example, include at least one of an on-board display and a head-up display.

Figure 29:
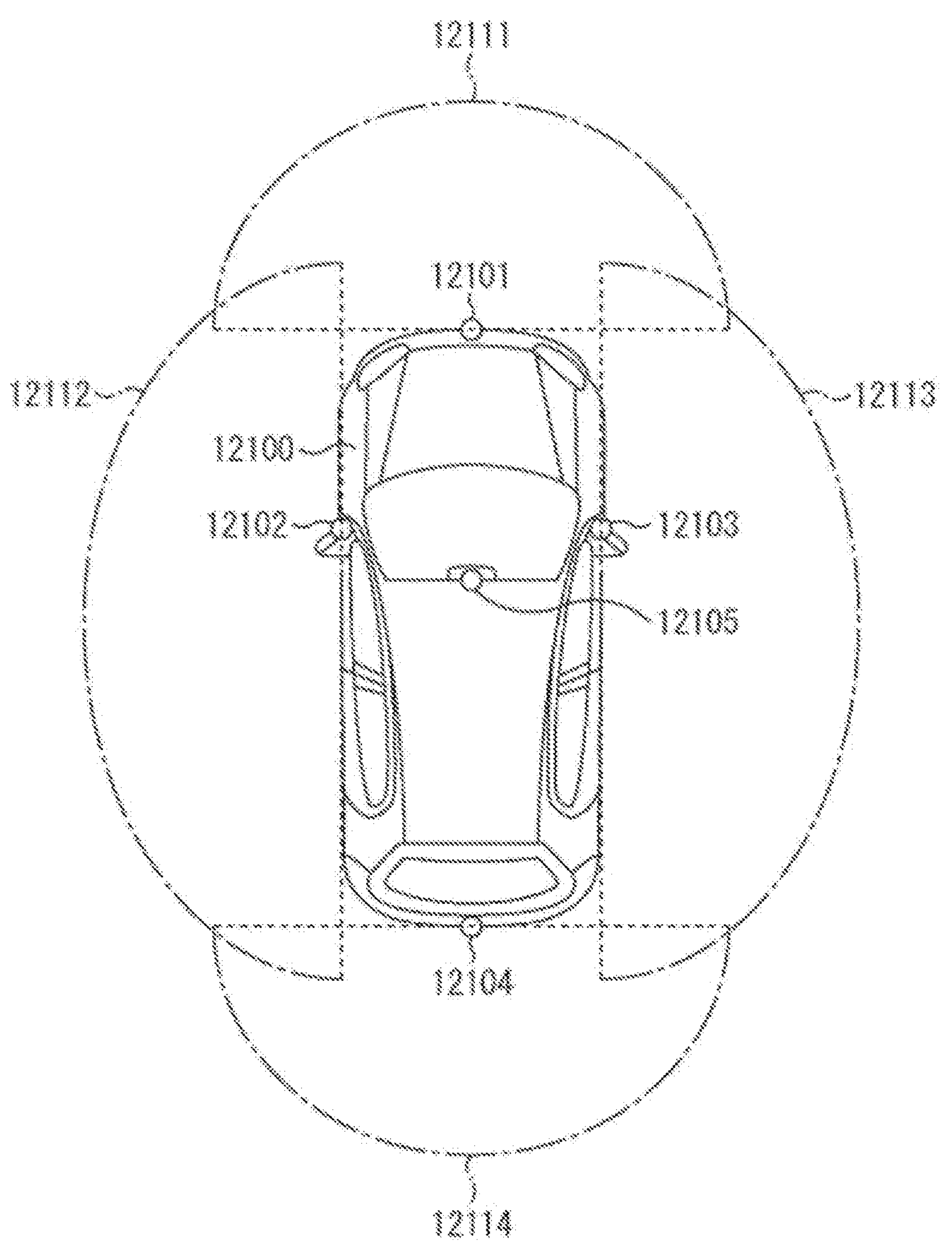
FIG. 29 is an illustrative view illustrating an example of an installation position of an outside-vehicle information detecting section and an imaging section.

FIG. 29 is a diagram illustrating an example of the installation position of the imaging section 12031.

In FIG. 29, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that, in FIG. 29, an example of imaging ranges of the imaging sections 12101 to 12104 is illustrated. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to, for example, the cameras included in the imaging sections 12031, 12101, 12102, 12103, 12104, and 12105 and the driver state detecting section 12041 among the above-described configurations. Also in these cases, it is advantageous to acquire a high-quality image with a small device configuration.

<Application Example to Endoscopic Surgery System>

The technology according to an embodiment of the present disclosure (present technology) can be applied to various products. For example, the technology according to the present disclosure may be applied to an endoscopic surgery system.

FIG. 30 is a view illustrating an example of a schematic configuration of the endoscopic surgery system to which the technology according to the present disclosure (present technology) may be applied.

FIG. 30 illustrates a state in which a surgeon (medical doctor) 11131 performs surgery on a patient 11132 on a patient bed 11133 by using an endoscopic surgery system 11000. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having a lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 31:
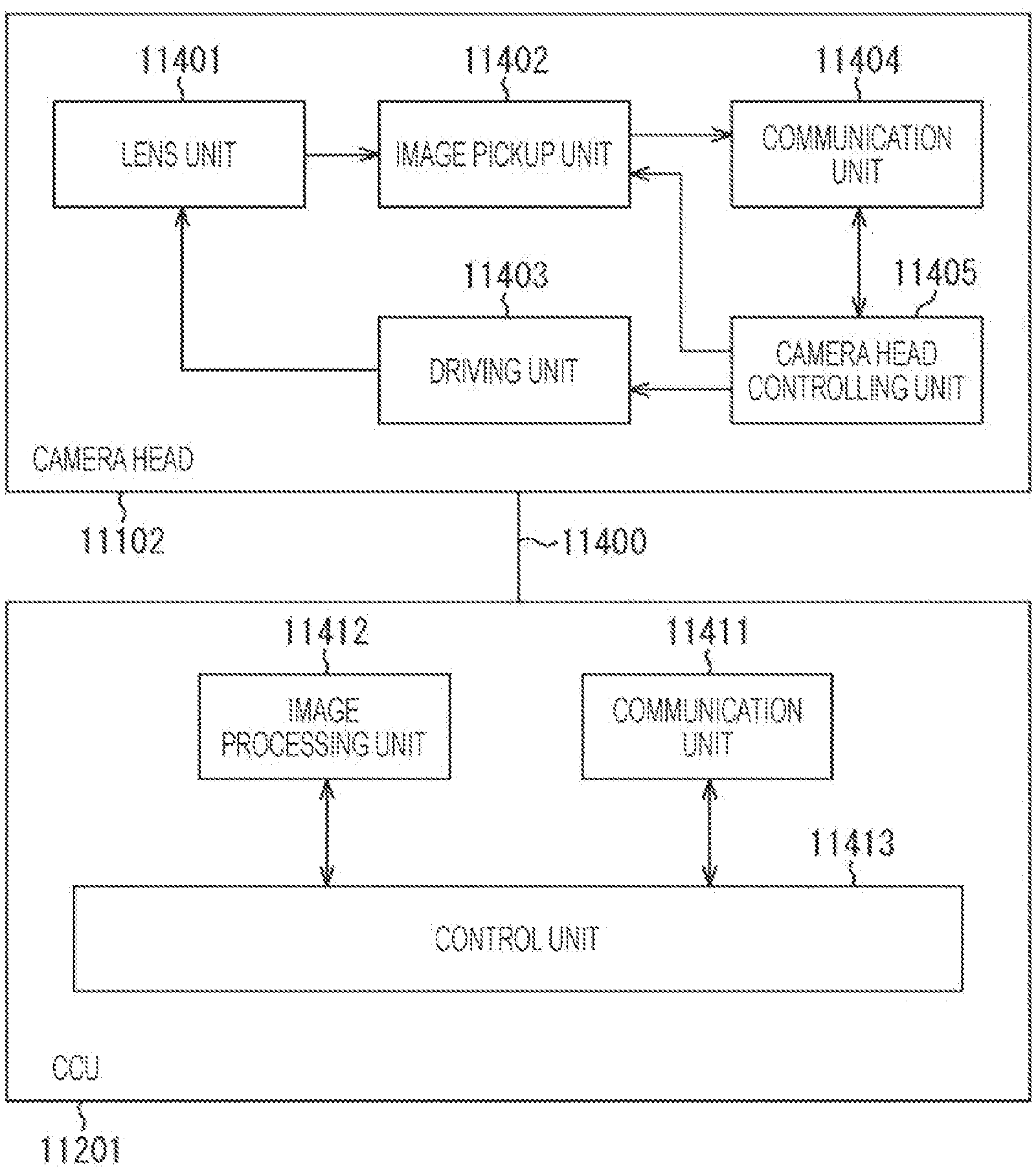
FIG. 31 is a block diagram illustrating an example of a functional configuration of a camera head and a CCU.

FIG. 31 is a block diagram illustrating an example of functional configurations of the camera head 11102 and the CCU 11201 illustrated in FIG. 30.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. Among the configurations described above, the technology according to the present disclosure can be applied to, for example, the camera head 11102 among the configurations described above. Also in this case, it is advantageous to acquire a high-quality image with a small device configuration.

Note that, here, the endoscopic surgery system has been described as an example, but the technology according to the present disclosure may be applied to, for example, a microscopic surgery system or the like.

It should be noted that the embodiments and modifications disclosed in the present specification are illustrative only in all respects and are not to be construed as limiting. The above-described embodiments and modifications can be omitted, replaced, and changed in various forms without departing from the scope and spirit of the appended claims. For example, the above-described embodiments and modifications may be combined in whole or in part, and other embodiments may be combined with the above-described embodiments or modifications. Furthermore, the effects of the present disclosure described in the present specification are merely exemplification, and other effects may be provided.

A technical category embodying the above technical idea is not limited. For example, the above-described technical idea may be embodied by a computer program for causing a computer to execute one or a plurality of procedures (steps) included in a method for manufacturing or using the above-described apparatus. In addition, the above-described technical idea may be embodied by a computer-readable non-transitory recording medium in which such a computer program is recorded.

APPENDIX

The present disclosure can also have the following configurations.

[Item 1]

An imaging element including:

a pixel substrate including an image sensor on which imaging light is incident;

a cover body facing the image sensor, the cover body being transmissive; and a diffractive lens having a plurality of protruding lens portions protruding from the cover body toward the image sensor, in which a space is provided between the plurality of protruding lens portions.

[Item 2]

The imaging element according to item 1, further including a photocurable resin film located between the image sensor and the diffractive lens and in contact with the plurality of protruding lens portions.

[Item 3]

The imaging element according to item 1 or 2, further including an inorganic film located between the image sensor and the diffractive lens and in contact with the plurality of protruding lens portions.

[Item 4]

The imaging element according to any one of items 1 to 3, further including a plurality of lens constituent layers stacked on each other, in which each of the plurality of lens constituent layers includes the cover body and the diffractive lens.

[Item 5]

The imaging element according to any one of items 1 to 4, in which the diffractive lens is located 60 μm or less away from the image sensor.

[Item 6]

The imaging element according to any one of items 1 to 5, in which planar sizes of the plurality of protruding lens portions periodically change with reference to a distance from an optical axis, and a cycle of change in the planar sizes of the plurality of protruding lens portions is based on a phase difference of 360° of light diffraction of the plurality of protruding lens portions, and in each cycle, the planar sizes of the plurality of the protruding lens portions decrease as the distance from the optical axis increases.

[Item 7]

The imaging element according to any one of items 1 to 6, in which planar sizes of the plurality of protruding lens portions periodically change with reference to a distance from an optical axis, and a cycle of change in the planar sizes of the plurality of protruding lens portions is based on a phase difference of 360° of light diffraction of the plurality of protruding lens portions, and in each cycle, the planar sizes of the plurality of the protruding lens portions increase as the distance from the optical axis increases.

[Item 8]

The imaging element according to any one of items 1 to 7, further including a fixing portion that is located between the pixel substrate and the cover body and fixes the cover body to the pixel substrate.

[Item 9]

The imaging element according to any one of items 1 to 8, in which a space is provided between the image sensor and the diffractive lens.

[Item 10]

The imaging element according to any one of items 1 to 9, further including:

a support body that supports the pixel substrate; and a fixing portion that is located between the support body and the cover substrate and fixes the cover body to the support body.

[Item 11]

An imaging device including:

a pixel substrate including an image sensor on which imaging light is incident;

a cover body facing the image sensor, the cover body being transmissive;

a diffractive lens having a plurality of protruding lens portions protruding from the cover body toward the image sensor; and an imaging lens located on a side opposite to the pixel substrate via the cover body, in which a space is formed between the plurality of protruding lens portions.

[Item 12]

The imaging device according to item 11, in which the diffractive lens reduces chromatic aberration of the imaging lens.

[Item 13]

The imaging device according to item 11 or 12, in which the diffractive lens emits the imaging light at a principal ray incident angle smaller than a principal ray incident angle of the imaging light from the imaging lens toward the diffractive lens.

[Item 14]

A method for manufacturing an imaging element, the method including:

fixing a cover body that is transmissive to a pixel substrate including an image sensor, in which a plurality of protruding lens portions constituting a diffractive lens and provided with a space therebetween is fixed to the cover body, and the cover body is fixed to the pixel substrate such that the plurality of protruding lens portions is located between the cover body and the pixel substrate.

[Item 15]

The method for manufacturing the imaging element according to item 14, the method further including:

applying a photocurable resin onto the pixel substrate; and curing a portion covering the image sensor in the photocurable resin on the pixel substrate by light irradiation, in which the cover body is fixed to the pixel substrate while the plurality of protruding lens portions faces a portion of the photocurable resin on the pixel substrate cured by the light irradiation.

[Item 16]

The method for manufacturing an imaging element according to item 14 or 15, the method further including applying an inorganic film on the pixel substrate, in which the cover body is fixed to the pixel substrate while the plurality of protruding lens portions faces the inorganic film.

REFERENCE SIGNS LIST

10 Imaging device
11 Imaging element
21 Geometric optical lens
22 Diffractive lens
23 Protruding lens portion
24 Air gap
31 Lower substrate
32 Upper substrate
33 Pixel substrate
34 Solder ball
35 Color filter
36 On-chip lens
37 Sealing resin
38 Cover body
40 Image sensor
41 Lens substrate film
42 Resist
45 Cover body wafer
46 Substrate wafer
48 Mask
49 Exposure device
50 Inorganic film
51 Film forming device
55 Lens constituent layer
56 Diffractive lens unit
57 Adhesive layer
60 Support body
61 Adhesive layer
62 Wire bond wiring
Ax Optical axis
D Vertical width
L Imaging light
L1 Short-wavelength light
L2 Long-wavelength light
P Pitch
S1 First cycle
S2 Second cycle
S3 Third cycle
s Phase difference
W Horizontal width
θ Refraction angle

What is claimed is:

1. An imaging element, comprising:
a pixel substrate including an image sensor;
a cover body facing the image sensor, the cover body being transmissive;
a diffractive lens having a plurality of protruding lens portions protruding from the cover body toward the image sensor,
wherein a space is provided between the plurality of protruding lens portions; and
a plurality of lens constituent layers stacked on each other,
wherein each of the plurality of lens constituent layers includes the cover body and the diffractive lens.

2. The imaging element according to claim 1, further comprising
a photocurable resin film located between the image sensor and the diffractive lens and in contact with the plurality of protruding lens portions.

3. The imaging element according to claim 1,
wherein the diffractive lens is located 60 μm or less away from the image sensor.

4. The imaging element according to claim 1,
wherein planar sizes of the plurality of protruding lens portions periodically change with reference to a distance from an optical axis, and a cycle of change in the planar sizes of the plurality of protruding lens portions is based on a phase difference of 360° of light diffraction of the plurality of protruding lens portions, and
wherein, in each cycle, the planar sizes of the plurality of the protruding lens portions increase as the distance from the optical axis increases.

5. The imaging element according to claim 1, further comprising
a fixing portion that is located between the pixel substrate and the cover body and fixes the cover body to the pixel substrate.

6. The imaging element according to claim 1, wherein a space is provided between the image sensor and the diffractive lens.

7. The imaging element according to claim 1,
wherein planar sizes of the plurality of protruding lens portions periodically change with reference to a distance from an optical axis, and a cycle of change in the planar sizes of the plurality of protruding lens portions is based on a phase difference of 360° of light diffraction of the plurality of protruding lens portions, and
in each cycle, the planar sizes of the plurality of the protruding lens portions decrease as the distance from the optical axis increases.

8. The imaging element according to claim 1,
wherein planar sizes of the plurality of protruding lens portions periodically change with reference to a distance from an optical axis, and a cycle of change in the planar sizes of the plurality of protruding lens portions is based on a phase difference of 360° of light diffraction of the plurality of protruding lens portions, and
wherein, in each cycle, the planar sizes of the plurality of the protruding lens portions decrease as the distance from the optical axis increases.

9. The imaging element according to claim 1, further comprising;
a support body that supports the pixel substrate; and
a fixing portion that is located between the support body and the cover substrate and fixes the cover body to the support body.

10. An imaging element, comprising:
a pixel substrate including an image sensor;
a cover body facing the image sensor, the cover body being transmissive; and
a diffractive lens having a plurality of protruding lens portions protruding from the cover body toward the image sensor,
wherein a space is provided between the plurality of protruding lens portions,
wherein planar sizes of the plurality of protruding lens portions periodically change with reference to a distance from an optical axis, and a cycle of change in the planar sizes of the plurality of protruding lens portions is based on a phase difference of 360° of light diffraction of the plurality of protruding lens portions, and
wherein, in each cycle, the planar sizes of the plurality of the protruding lens portions:
1) Decrease as the distance from the optical axis increases, or
2) increase as the distance from the optical axis increases.

11. The imaging element according to claim 10, further comprising
an inorganic film located between the image sensor and the diffractive lens and in contact with the plurality of protruding lens portions.

12. The imaging element according to claim 10, further comprising a plurality of lens constituent layers stacked on each other, wherein each of the plurality of lens constituent layers includes the cover body and the diffractive lens.

13. The imaging element according to claim 10, further comprising a photocurable resin film located between the image sensor and the diffractive lens and in contact with the plurality of protruding lens portions.

14. The imaging element according to claim 10, wherein the diffractive lens is located 60 μm or less away from the image sensor.

15. The imaging element according to claim 10, further comprising a fixing portion that is located between the pixel substrate and the cover body and fixes the cover body to the pixel substrate.

16. An imaging element, comprising:

a pixel substrate including an image sensor;

a cover body facing the image sensor, the cover body being transmissive;

a diffractive lens having a plurality of protruding lens portions protruding from the cover body toward the image sensor, wherein a space is provided between the plurality of protruding lens portions;

a support body that supports the pixel substrate; and a fixing portion that is located between the support body and the cover substrate and fixes the cover body to the support body.

17. An imaging device, comprising:

a pixel substrate including an image sensor;

a cover body facing the image sensor, the cover body being transmissive;

a diffractive lens having a plurality of protruding lens portions protruding from the cover body toward the image sensor; and an imaging lens located on a side opposite to the pixel substrate via the cover body, wherein a space is formed between the plurality of protruding lens portions, and wherein the diffractive lens emits light at a principal ray incident angle smaller than a principal ray incident angle of light from the imaging lens toward the diffractive lens.

18. The imaging device according to claim 17, wherein the diffractive lens reduces chromatic aberration of the imaging lens.

19. A method for manufacturing an imaging element, the method comprising:

fixing a cover body that is transmissive to a pixel substrate including an image sensor, wherein a plurality of protruding lens portions constituting a diffractive lens and provided with a space therebetween is fixed to the cover body, and wherein the cover body is fixed to the pixel substrate such that the plurality of protruding lens portions is located between the cover body and the pixel substrate;

applying a photocurable resin onto the pixel substrate; and curing a portion covering the image sensor in the photocurable resin on the pixel substrate by light irradiation, wherein the cover body is fixed to the pixel substrate while the plurality of protruding lens portions faces a portion of the photocurable resin on the pixel substrate cured by the light irradiation.

20. The method for manufacturing an imaging element according to claim 19, the method further comprising applying an inorganic film on the pixel substrate, wherein the cover body is fixed to the pixel substrate while the plurality of protruding lens portions faces the inorganic film.

* * * * *